(12) United States Patent
Hanyu et al.

(10) Patent No.: US 10,783,936 B2
(45) Date of Patent: Sep. 22, 2020

(54) READING DEVICE AND LOGIC DEVICE

(71) Applicant: Tohoku University, Miyagi (JP)

(72) Inventors: Takahiro Hanyu, Miyagi (JP); Daisuke Suzuki, Miyagi (JP); Hideo Ohno, Miyagi (JP); Tetsuo Endoh, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 16/466,812

(22) PCT Filed: Dec. 8, 2017

(86) PCT No.: PCT/JP2017/044150
§ 371 (c)(1),
(2) Date: Aug. 21, 2019

(87) PCT Pub. No.: WO2018/105719
PCT Pub. Date: Jun. 14, 2018

(65) Prior Publication Data
US 2019/0371370 A1     Dec. 5, 2019

(30) Foreign Application Priority Data
Dec. 9, 2016   (JP) ................. 2016-239688

(51) Int. Cl.
G11C 7/00     (2006.01)
G11C 7/06     (2006.01)
G11C 16/26    (2006.01)

(52) U.S. Cl.
CPC .............. G11C 7/067 (2013.01); G11C 7/065 (2013.01); G11C 16/26 (2013.01)

(58) Field of Classification Search
CPC ....... G11C 7/1051; G11C 7/22; G11C 7/1072; G11C 7/1006; G11C 7/1066
(Continued)

(56) References Cited

U.S. PATENT DOCUMENTS 6,411,550 B1    6/2002   Nasu
7,746,671 B2 *  6/2010   Radecker .......... H02M 3/33507
                                                  323/244

FOREIGN PATENT DOCUMENTS

JP    H07153292 A    6/1995
JP    2008235621 A  10/2008

OTHER PUBLICATIONS

S. Yamamoto et al.:"Nonvolatile Power-Gating Field-Programmable Gate Array Using Nonvolatile Static Random Access Memory and Nonvolatile Flip-Flops Based on Pseudo-Spin-Transistor Architecture with Spin-Transfer-Torque Magnetic Tunnel Junctions", Japanese Journal of Applied Physics 51 (2012) 11PB02, Nov. 20, 2012.

(Continued)

Primary Examiner — Son T Dinh
(74) Attorney, Agent, or Firm — Fox Rothschild LLP; Robert J. Sacco

(57) ABSTRACT

In reading of a memory unit, an read failure operation due to variation in characteristic of a transistor in a dynamic load is reduced. A read circuit that reads a voltage obtained by a voltage division of a dynamic load unit and the memory unit as an output of the memory unit includes the dynamic load unit having one end connected to a side of a power supply and the other end connected to a side of the memory unit, and a feedback unit that, by a feedback of the voltage obtained by the voltage division that is divided between the dynamic load unit and the memory unit, holds the voltage obtained by the voltage division. The dynamic load unit has an array structure in which a plurality of resistive memory elements are connected in series, in parallel, or in series-parallel. The dynamic load unit has the array structure of the resistive memory elements and this structure can suppress (Continued)

the read failure operation due to the variation in dynamic load.

12 Claims, 17 Drawing Sheets

(58) Field of Classification Search
USPC .......................................... 365/189.15, 189.14
See application file for complete search history.

(56) References Cited

OTHER PUBLICATIONS

D. Suzuki et al.: "Six-input lookup table circuit with 62% fewer transistors using nonvolatile logic-in-memory architecture with series/parallel-connected magnetic tunnel junctions", Journal of Applied Physics 111, 07E318 (2012), Feb. 24, 2012.
D. Suzuki et al.: "A 71%-Area-Reduced Six-Input Nonvolatile Lookup-Table Circuit Using a Three-Terminal Magnetic-Tunnel-Junction-Based Single-Ended Structure", Japanese Journal of Applied Physics 52 (2013), Mar. 21, 2013.
D. Suzuki et al: "Design of an MTJ-Based Nonvolatile Lookup Table Circuit Using an Energy-Efficient Single-Ended Logic-In-Memory Structure", Conference: 2015 IEEE 58th International Midwest Symposium on Circuits and Systems (MWSCAS).

* cited by examiner (a)

(b)

(b) SERIES-PARALLEL CONNECTION (a) SERIES CONNECTION

READING LOW RESISTANCE R0

(a) READING (CORRECT)   (b) READING (FAILURE)

READING HIGH RESISTANCE R1

(c) READING (CORRECT)   (d) READING (FAILURE)

READING DEVICE AND LOGIC DEVICE

CROSS REFERENCE TO RELATED APPLICATIONS

This application is a § 371 U.S. National Phase Entry of International Patent Application No. PCT/JP2017/044150, filed on Dec. 8, 2017, which claims priority to and the benefit of Japanese Patent Application No. 2016-239688, filed on Dec. 9, 2016, the entireties of which are hereby incorporated herein by reference.

TECHNICAL FIELD

The present invention relates to a read circuit, and a logic circuit including the read circuit.

BACKGROUND ART

As a programmable logic circuit, for example, a field-programmable gate array (FPGA) including a programmable gate array whose logic operating function is programmable has been known. A nonvolatile FPGA, by having a logic device structure including a resistive memory element where the resistive memory elements store circuit information even after the power is turned off, can reduce the standby power consumption.

In the nonvolatile programmable logic circuit, there are redundant circuit components due to the programmability. Therefore, simply replacing a volatile memory element with a nonvolatile memory element results in the increase of the circuit scale, and also the increase of the device area (see Non Patent Literature 1). In order to suppress the increase of the device area, a nonvolatile logic-in-memory (LIM) circuit where the nonvolatile storage function and logic function are merged by the nonvolatile logic circuit technique has been proposed.

FIG. 12 shows a schematic diagram of the logic circuit where the nonvolatile LIM circuit technique is utilized. A logic circuit (nonvolatile LIM circuit) 100 includes a memory unit 101 that performs both memory function and logic operating function through communication in the same block, a write circuit 103 that stores the content of the memory function or the logic operating function, and a sensing amplifier 102 that reads the logic operation result. The sensing amplifier 102 is connected to a bus 104. Note that in the input/output relation of outputting an output signal in response to an input signal, if the input/output relation is the memory of data, the memory unit is regarded as the memory function and if the input/output relation is the logic operation, the memory unit is regarded as the logic operating function; thus, the memory unit has one of these functions or both functions through communication. In the description below, the output read from the memory unit is the logic operation result or the memory state.

FIG. 13 illustrates structure examples of logic circuits (nonvolatile LIM circuits) 100A to 100C that have conventionally been proposed, in each of which a resistive memory element is used as the storage element. FIG. 13 illustrates only the read circuit and does not illustrate the write circuit.

The logic circuit (nonvolatile LIM circuit) 100A illustrated in (a) of FIG. 13 has a differential circuit structure, and a resistive memory element 101A1 and a reference resistor 101A2 have a differential structure. In such a differential circuit structure, the circuit structure is complicated and the circuit scale becomes large (see Non Patent Literature 2).

The logic circuit (nonvolatile LIM circuit) 100B illustrated in (b) of FIG. 13 has a single ended circuit structure, in which the voltage obtained by the voltage division between a resistive memory element 101B and an output load 102B2, which are connected to each other in series, is output from an inverter 102B1. In the single ended circuit structure, the circuit scale is small but the read current and the DC current are large. In addition, if the resistance difference of the memory element is small, it is difficult to secure the sufficient read margin (see Non Patent Literature 3).

The logic circuit (nonvolatile LIM circuit) 100C illustrated in (c) of FIG. 13 has a single ended circuit structure, in which in a reading circuit 102C formed by an inverter 102C1 and a PMOS feedback transistor 102C2, the voltage obtained by the voltage division is fed back to the feedback transistor 102C2, so that the output is held. In this feedback structure, the read current and DC current are reduced (see Non Patent Literature 4).

CITATION LIST

Patent Literature

Patent Literature 1: Japanese Patent No. 5433845

Non Patent Literatures

Non Patent Literature 1: Nonvolatile Power-Gating Field-Programmable Gate Array Using Nonvolatile Static Random Access Memory and Nonvolatile Flip-Flops Based on Pseudo-Spin-Transistor Architecture with Spin-Transfer-Torque Magnetic Tunnel Junctions. Japanese Journal of Applied Physics 51 (2012) 11PB0211PB02-1 #2012, The Japan Society of Applied Physics.

Non Patent Literature 2: Six-input lookup table circuit with 62% fewer transistors using nonvolatile logic-in-memory architecture with series/parallel-connected magnetic tunnel junctions. JOURNAL OF APPLIED PHYSICS 111, 07E318 (2012) JOURNAL OF APPLIED PHYSICS 111, 07E318 (2012).

Non Patent Literature 3: A 71%-Area-Reduced Six-Input Nonvolatile Lookup-Table Circuit Using a Three-Terminal Magnetic-Tunnel-Junction-Based Single-Ended Structure. JOURNAL OF APPLIED PHYSICS 111, 07E318 (2012)

Non Patent Literature 4: Design of an MTJ-Based Nonvolatile Lookup Table Circuit Using an Energy-Efficient Single-Ended Logic-In-Memory Structure. Proceedings of IEEE Midwest Symposium on Circuits and Systems, pp. 1-4, (2015).

SUMMARY OF INVENTION

Technical Problem

In the single ended circuit structure by the feedback structure as described the above, the space can be saved in the circuit scale and the read current and the DC current can be reduced, which is advantageous; however, there has been a problem in the point of an incorrect operation due to variation in characteristic of a dynamic load.

FIG. 14 shows a diagram of an example of a single ended circuit structure by a feedback structure.

A logic circuit (nonvolatile LIM circuit) 110 includes a memory unit 111, a reading unit 112, and a switching unit 113, and the output of the reading unit 112 is held by a latch 114. The memory unit 111 includes, for example, a cell 111A having resistive memory elements disposed in an array form, and a selecting unit 111B that selects the resistive memory element in the cell 111A. The selecting unit 111B can be formed by a tree structure of NMOS transistors.

The reading unit 112 includes a series connection circuit in which a PMOS transistor MP0 included in a dynamic load 112a is connected in series to a feedback circuit 112b including an inverter 112b1 and a feedback transistor 112b2 of a PMOS transistor MP1. The inverter 112b1 has its input connected to a drain of the feedback transistor 112b2 of the PMOS transistor MP1, and its output fed back to a gate of the feedback transistor 112b2 of the PMOS transistor MP1.

The feedback transistor 112b2 of the PMOS transistor MP1 has the drain connected to the selecting unit 111B of the memory unit 111 through the switching unit 113.

During the reading operation, the reading unit 112 and the memory unit 111 are connected to each other at a connection point S by the switching operation of the switching unit 113. The reading unit 112 outputs from the output node of the reading unit 112, the voltage Vs obtained by the voltage division of a power supply voltage VDD by the resistance of the dynamic load in the reading unit 112 and the resistance of the memory unit 111 that is selected by the selecting unit 111B. The voltage Vs obtained by the voltage division is the output corresponding to the logic operation result of the memory unit 111.

The feedback circuit accelerates the transition of output voltage in accordance with the level (High/Low) of the voltage Vs obtained by the voltage division by turning on/off the feedback transistor 112b2 (MP1) on the basis of the comparison between the voltage Vs obtained by the voltage division at the connection point S and a threshold voltage VINV of the inverter 112b1, and holds the voltage.

FIG. 15 and FIG. 16 show diagrams for describing an incorrect operation due to the variation in characteristic of the dynamic load. FIG. 15 illustrates a state in which the logic operation result of the memory unit 111 is read by the reading unit 112. The logic operation result from the memory unit 111 is output as a low resistance R0 or a high resistance R1, and the reading unit 112 reads the logic operation result in accordance with the level of the voltage obtained by the voltage division between the resistance of the memory unit 111 and the resistance of the dynamic load. In the drawings, the low resistance R0 and the high resistance R1 correspond to the memory state or the logic operation result of the memory unit 111.

The present inventors have found out that, in the reading circuit in the feedback structure, the read failure results from the variation in dynamic load in the reading circuit.

(a), (b), (c), and (d) of FIG. 15 illustrate states in which the low resistance R0 and the high resistance R1 are read, respectively. (a) and (c) of FIG. 15 illustrate the state in which the reading is performed correctly, and (b) and (d) of FIG. 15 illustrate the state in which the reading is performed incorrectly.

In FIG. 15, in the initial state, a PMOS transistor MP2 is turned on so that the voltage at the connection point S between the reading unit 112 and the memory unit 111 is in the voltage state of the power supply voltage VDD.

In the case of reading the low resistance R0, the feedback transistor 112b2 of the PMOS transistor MP1 is turned on to connect between the reading unit 112 and the memory unit 111. Here, the voltage Vs obtained by the voltage division at the connection point S is the low voltage (Low) divided by the resistance of the transistor 112a corresponding to the resistor of the dynamic load of the reading unit 112 and the low resistance R0 of the memory unit 111.

The inverter 112b1 feeds back the voltage (High), which is the inversion of the low voltage (Low), to the feedback transistor 112b2 (MP1) and the feedback transistor 112b2 (MP1) is turned off. The voltage Vs obtained by the voltage division at the connection point S quickly becomes low because the feedback transistor 112b2 (MP1) is turned off.

In the reading of the low resistance R0, as the driving current increases due to the variation in characteristic of the transistor 112a (PMOS transistor MP0) included in the dynamic load, the voltage Vs obtained by the voltage division at the connection point S increases to become high voltage (High). If this voltage Vs obtained by the voltage division is the high voltage (High) exceeds the threshold voltage VINV of the inverter 112b1, the low voltage (Low) that is inverted in the inverter 112b1 is fed back to the feedback transistor 112b2 (MP1) and the feedback transistor 112b2 (MP1) is turned on. Since the feedback transistor 112b2 (MP1) is turned on, the voltage Vs obtained by the voltage division at the connection point S is kept as the high voltage (High) and the voltage is incorrectly read as the high voltage (High) although the voltage should be read as the low voltage (Low); thus, the incorrect operation occurs.

On the other hand, in the case of reading the high resistance R1, the feedback transistor 112b2 of the PMOS transistor MP1 is turned on to connect between the reading unit 112 and the memory unit 111. Here, the voltage Vs obtained by the voltage division at the connection point S is the high voltage (High) divided by the resistance of the transistor 112a (PMOS transistor MP0) included in the dynamic load of the reading unit 112 and the high resistance R1 of the memory unit 111.

The inverter 112b1 feeds back the low voltage (Low), which is the inversion of the high voltage (High), to the feedback transistor 112b2 (MP1), and the feedback transistor 112b2 (MP1) is turned on. The voltage Vs obtained by the voltage division at the connection point S is held as the high voltage because the feedback transistor 112b2 (MP1) is turned on.

In the reading of the high resistance R1, as the driving current decreases due to the variation in characteristic of the transistor 112a (PMOS transistor MP0) included in the dynamic load, the voltage Vs obtained by the voltage division at the connection point S decreases to become the low voltage (Low). If this voltage Vs obtained by the voltage division having the low voltage (Low) is lower than the threshold voltage VINV of the inverter 112b1, the high voltage (High) that is inverted in the inverter 112b1 is fed back to the feedback transistor 112b2 (MP1) and the feedback transistor 112b2 (MP1) is turned on. Since the feedback transistor 112b2 (MP1) is turned off, the voltage Vs obtained by the voltage division at the connection point S becomes the low voltage (Low) and the voltage is incorrectly read as the low voltage (Low) although the voltage should be read as the high voltage (High); thus, the incorrect operation occurs.

FIG. 16 shows a diagram for describing the relation between the voltage Vs obtained by the voltage division and the threshold voltage VINV of the inverter and the read failure operation due to the variation in dynamic load.

(a) of FIG. 16 schematically illustrates the relation between the voltage Vs obtained by the voltage division and the threshold voltage VINV of the inverter. The voltage Vs obtained by the voltage division is determined in a manner that the intersection between the voltage-current characteristic of the dynamic load shown by a dashed line in the drawing and the voltage-current characteristics of the resistive memory elements included in the memory unit 111 shown by solid lines in the drawing is used as the operating point. Note that, of the voltage-current characteristics of the resistive memory elements that are shown by the solid lines, the upper solid line indicates the low resistance case and the lower solid line indicates the high resistance case.

The threshold of the inverter is the threshold voltage VINV, and if the voltage Vs obtained by the voltage division is the high voltage (Vhigh) that is higher than the threshold voltage VINV, the feedback transistor is turned off to hold the voltage Vs obtained by the voltage division as the high voltage. This operation is shown by an arrow H in (a) of FIG. 16. On the other hand, if the voltage Vs obtained by the voltage division is the low voltage (Vlow) that is lower than the threshold voltage VINV, the feedback transistor is turned on to keep the voltage Vs obtained by the voltage division as the low voltage. This operation is shown by an arrow "L" in (a) of FIG. 16.

In the normal operation as described above, if the voltage-current characteristic of the dynamic load should vary, the read failure operation occurs.

(b) of FIG. 16 illustrates an operation example in which the voltage-current characteristic of the dynamic load has varied to the low-resistance side. A dot-chain line in (b) of FIG. 16 indicates the voltage-current characteristic when the voltage-current characteristic of the dynamic load has varied to the low-resistance side. Here, if the voltage Vlow-ER at the operating point where the voltage-current characteristic of the dynamic load and the voltage-current characteristic of the resistive memory element intersect is higher than the threshold voltage VINV of the inverter, the inverter turns off the feedback transistor and the voltage Vs obtained by the voltage division becomes the high voltage, which is the incorrect operation. In (b) of FIG. 16, the arrow of a dot-chain line indicated by HER shows this incorrect operation.

On the other hand, (c) of FIG. 16 illustrates an operation example in which the voltage-current characteristic of the dynamic load has varied to the high-resistance side. A two-dot-chain line in (c) of FIG. 16 indicates the voltage-current characteristic when the voltage-current characteristic of the dynamic load has varied to the high-resistance side. Here, if the high voltage Vhigh at the operating point where the voltage-current characteristic of the dynamic load and the voltage-current characteristic of the resistive memory element intersect is lower than the threshold voltage VINV of the inverter, the inverter turns on the feedback transistor and the voltage Vs obtained by the voltage division becomes the low voltage, which is the incorrect operation. In the drawing, the arrow of a two-dot-chain line indicated by LER shows this incorrect operation. In (b) and (c) of FIG. 16, the area shown by a shaded pattern indicates the range of the voltage obtained by the voltage division where the inverter operates correctly; if the operating point is in this range, the operation is correct and if the operating point is out of this range, the operation is incorrect.

Therefore, in the reading circuit, one cause of the read failure operation is the variation in characteristic of the transistor included in the dynamic load, and more specific causes are shown below:

(a) variation in the voltage obtained by the voltage division due to variation in driving current; and (b) variation in operation of the inverter due to variation in the voltage obtained by the voltage division.

The variation in operation of the inverter due to the variation in the voltage obtained by the voltage division is caused as the voltage Vs obtained by the voltage division varies with respect to the threshold voltage in the inverter operation, and it can be said that the reading margin in the read circuit is small. In order to suppress the read failure operation, the read margin is preferably larger.

As one possible structure for reducing the variation in resistance of the dynamic load in the reading circuit, a structure in which a PMOS transistor is selected to be used from among a plurality of PMOS transistors having different characteristics may be investigated as a potential response. FIG. 17 illustrates one structure example of the reading circuit for reducing the variation by freely selecting the POMS to be used from the PMOS transistors that are examined.

A reading circuit 122 of a logic circuit (nonvolatile LIM circuit) 120 includes a plurality of PMOS transistors (S1 to Sn) with different gate lengths that are connected in parallel to form an array structure. Among the PMOS transistors (S1 to Sn) in the array structure, the PMOS transistor to be used is selected to adjust the driving current, so that the operating point of the voltage obtained by the voltage division is adjusted. Thus, the incorrect operation due to the variation in dynamic load is suppressed.

In this structure, however, the area is increased due to the array structure of the PMOS transistor and additionally, the selected PMOS transistor does not have the storing function; therefore, a memory circuit is additionally required to hold the adjustment result as to which PMOS transistor has been selected in the adjustment. Moreover, in every reading, it is necessary to select the PMOS transistor on the basis of the data read from the memory circuit and adjust the resistance.

From the viewpoint of the above, an object of the present invention is to solve the conventional problem described above and to reduce the read failure operation due to the variation in characteristic of the transistor in the dynamic load.

Solution to Problem

A read circuit according to the present invention is a read circuit that reads a voltage obtained by the voltage division between a resistance of a dynamic load unit and a resistance of a memory unit, as an output of the memory unit. The read circuit includes the dynamic load unit having one end connected to a side of a power supply and the other end connected to a side of the memory unit, and a feedback unit that, by a feedback of the voltage obtained by the voltage division between the dynamic load unit and the memory unit, holds the voltage obtained by the voltage division. The dynamic load unit has an array structure in which a plurality of resistive memory elements are connected in series, in parallel, or in series-parallel. A logic circuit according to the present invention includes the read circuit according to the present invention as a reading circuit.

The read circuit and the logic circuit according to the present invention include the dynamic load unit with the array structure in which the resistive memory elements are connected in series, in parallel, or in series-parallel; thus, (a) variation in the voltage obtained by the voltage division due to variation in driving current, and (b) variation in operation of inverter due to variation in the voltage obtained by the voltage division can be reduced.

As the variation in the voltage obtained by the voltage division and the variation in the operating point of the inverter are reduced, the variation in the voltage Vs obtained by the voltage division with respect to the threshold voltage of the inverter can be reduced and the read margin in the read circuit can be increased. Moreover, the incorrect operation caused by the variation in dynamic load can be reduced.

(Mode of Dynamic Load)

In the present invention, the dynamic load unit may include a PMOS transistor in addition to the array structure of the resistive memory element.

The PMOS transistor included in the dynamic load unit may have a plurality of connection modes, and for example, the PMOS transistor can have any of the following connection modes:

(a) a connection mode of being connected in series between the power supply and the array structure, (b) a connection mode of being connected in series between the array structure and the feedback unit, and (c) a connection mode of being connected in parallel between the power supply and the feedback unit.

The dynamic load unit according to the present invention, which has the resistive memory elements in the array structure, varies in resistance less than each resistive memory element and varies less in characteristic than a dynamic load unit formed by CMOS.

The technique of compensating the variation in transistor using the resistive memory elements is already disclosed in Patent Literature 1. However, Patent Literature 1 neither describes nor suggests that the compensation of the variation in characteristic of the dynamic load is employed in the structure of reducing the variation in operation of the inverter in the read circuit.

The present invention has been made in the viewpoint of the operating point of the inverter in the read circuit, and provides the special effects of reducing (a) variation in the voltage obtained by the voltage division due to variation in driving current, and (b) variation in operation of the inverter due to variation in the voltage obtained by the voltage division.

(Mode of Feedback Unit)

In the present invention, the feedback unit includes the feedback transistor and the inverter.

The feedback transistor can have a plurality of connection modes, and for example, the feedback transistor can have any of the following connection modes:

(a) a connection mode of connecting a PMOS transistor between an end of the dynamic load unit opposite to an end thereof on the power supply side and an output of the memory unit, and (b) a connection mode of connecting a PMOS transistor between the power supply and the end of the dynamic load unit on the power supply side.

The inverter is connected between the output of the memory unit and the gate of the feedback transistor. The voltage obtained by the voltage division between the dynamic load unit and the memory unit is input to the inverter, and on the basis of the comparison between the voltage obtained by the voltage division and the threshold voltage of the inverter, the feedback transistor is turned on/off to accelerate the change of the voltage obtained by the voltage division and the changed voltage obtained by the voltage division is held.

(Mode of Switching Unit)

In the present invention, a switching unit is provided between the feedback unit and the memory unit to switch the connection between the power supply voltage and the feedback unit and the connection between the dynamic load unit and the memory unit through the feedback unit.

The switching unit switches between the first operation at an initial stage of the reading and the second operation of reading the logic operation result of the memory unit as the voltage obtained by the voltage division in the reading operation.

In the first operation, the power supply and the feedback unit are connected. During this connection, the operation of stopping the reading from the memory unit and the operation of charging the feedback unit with the power supply voltage are performed. By the first operation, the feedback unit is charged with the power supply voltage.

In the second operation, the dynamic load unit and the memory unit are connected through the feedback unit. During this connection, the operation of connecting the feedback unit and the memory unit and the operation of stopping the charging of the feedback unit with the power supply voltage are performed. By the second operation, the voltage which is obtained by dividing the power supply voltage between the dynamic load unit and the memory unit, is applied to the feedback unit and by the level of this voltage obtained by the voltage division, the memory state or the logic operation result of the memory unit is read.

(Mode of Resistive Memory Element)

The resistive memory element included in the dynamic load unit may be a resistance change type magnetic tunnel junction element (MTJ device). In addition to the MTJ device, various elements including a resistive random access memory (ReRAM) that utilizes a magnetic induction drastic resistance change, a phase change random access memory (PCRAM) that utilizes the phase change, and other phase change memories can be used.

The structure of the resistive memory element included in the dynamic load unit can have a plurality of modes.

(a) One mode of the resistive memory element is a three-terminal element structure, and is a memory element with the variable resistance including a conductive electrode at one end and a reading electrode at the other end, and changes in resistance when writing current is supplied to the conductive electrode.

(b) Another mode of the resistive memory element is a two-terminal element structure that has a tunnel barrier layer between a magnetization fixed layer and a magnetization free layer, and changes in resistance when writing current is supplied to the magnetization fixed layer or the magnetization free layer.

In either resistive memory element, the resistance state of the resistive memory element is determined by the writing state, and by correlating this resistance state with the logic operation result, the logic operating function of the memory unit is set.

(Mode of Memory Unit)

The memory unit is used for storing a truth table for a logic operating function such as an adder and also stores the input/output relation. The memory unit may include a cell in which the resistive memory elements are disposed in an array form, and a selecting unit that selects the resistive memory element in the cell. The memory unit stores the input/output relation of outputting an output signal in response to an input signal. The memory function is the function regarding the input/output relation as the memory of data, and the logic operating function is the function regarding the input/output relation as the logic operation. One of or both functions can be performed through communication. Here, the output read from the memory unit is described as the logic operation result or the memory state.

(Logic Circuit)

The logic circuit according to the present invention includes the memory unit, the writing unit that writes the writing function of the memory unit, and the reading unit that reads the output of the memory unit. The reading unit is formed using the read circuit according to the present invention.

Advantageous Effect of Invention

As described above, the read circuit and the logic circuit according to the present invention can reduce the read failure operation due to the variation in characteristic of the transistor of the dynamic load in the reading of the memory unit.

DESCRIPTION OF EMBODIMENT

An embodiment of the present invention is hereinafter described in detail with reference to the drawings.

Figure 1:
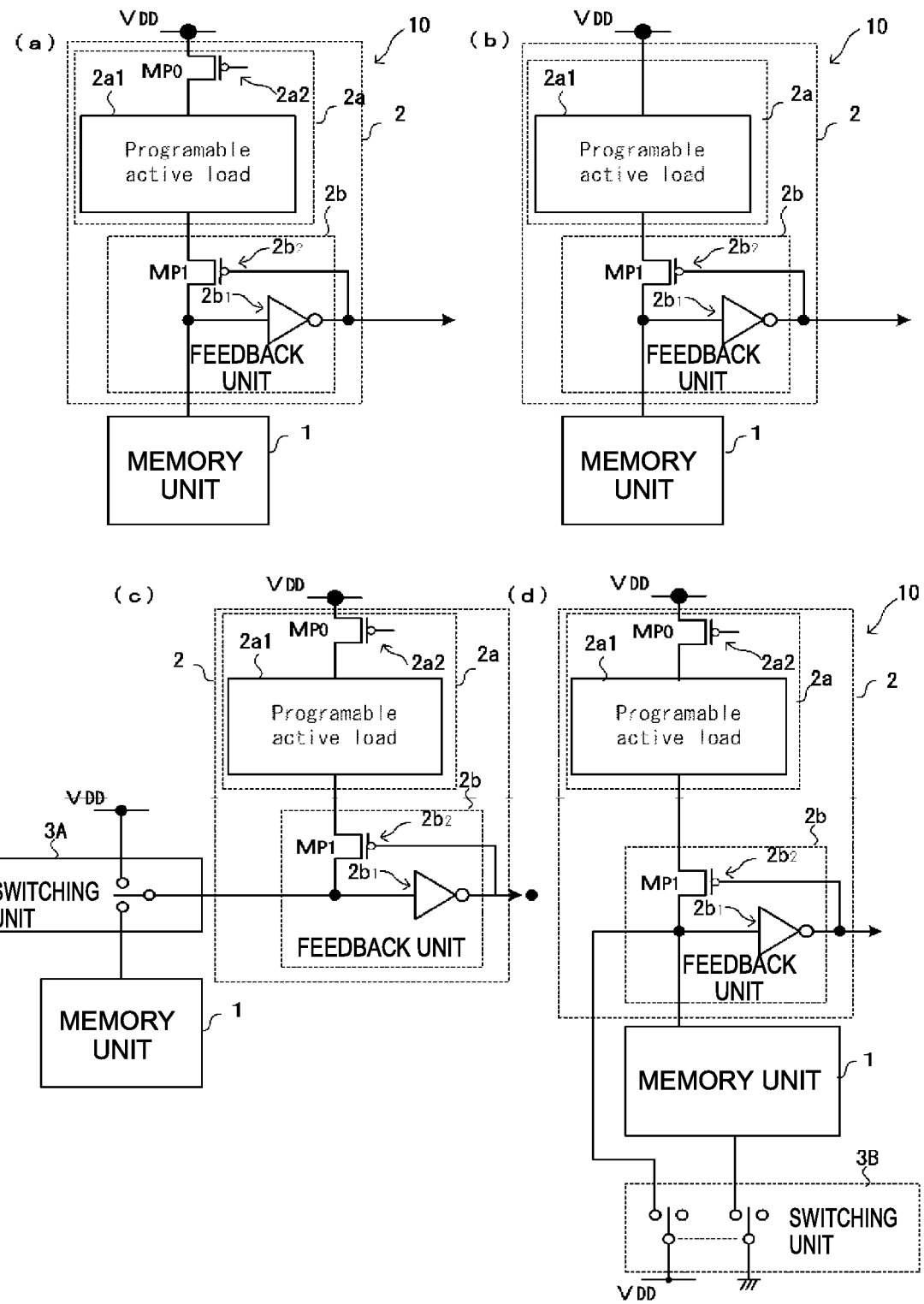
FIG. 1 shows a schematic diagram of a read circuit and a logic circuit according to the present invention.
Figure 2:
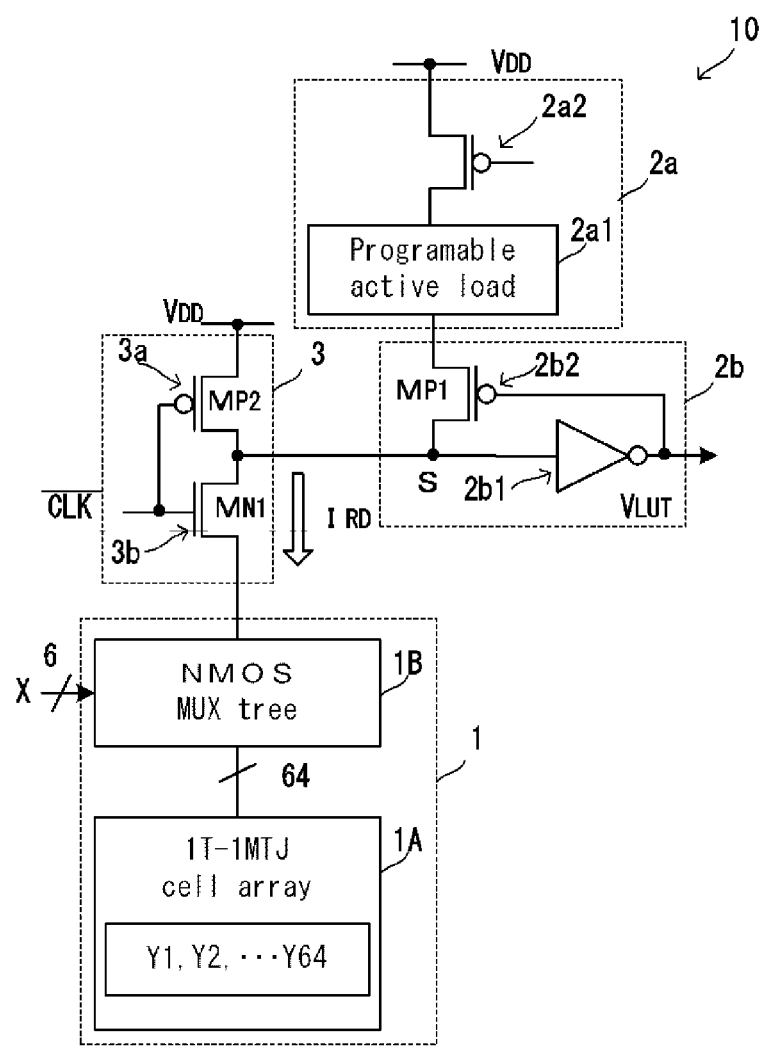
FIG. 2 shows a detailed schematic diagram of the read circuit and the logic circuit according to the present invention.
Figure 7:
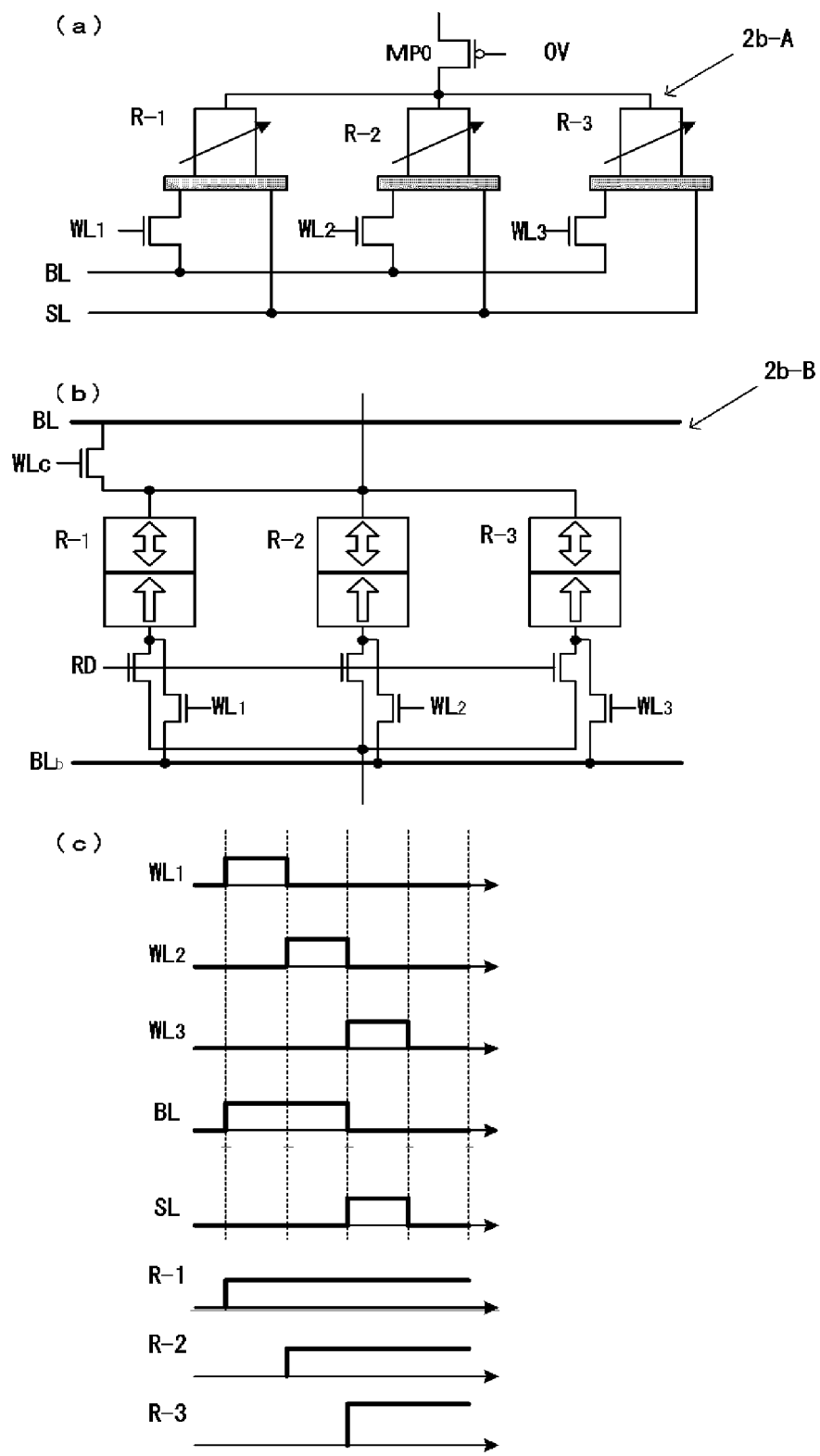
FIG. 7 shows a schematic diagram of a dynamic load unit with an array structure in which resistive memory elements are connected in parallel.
Figure 8:
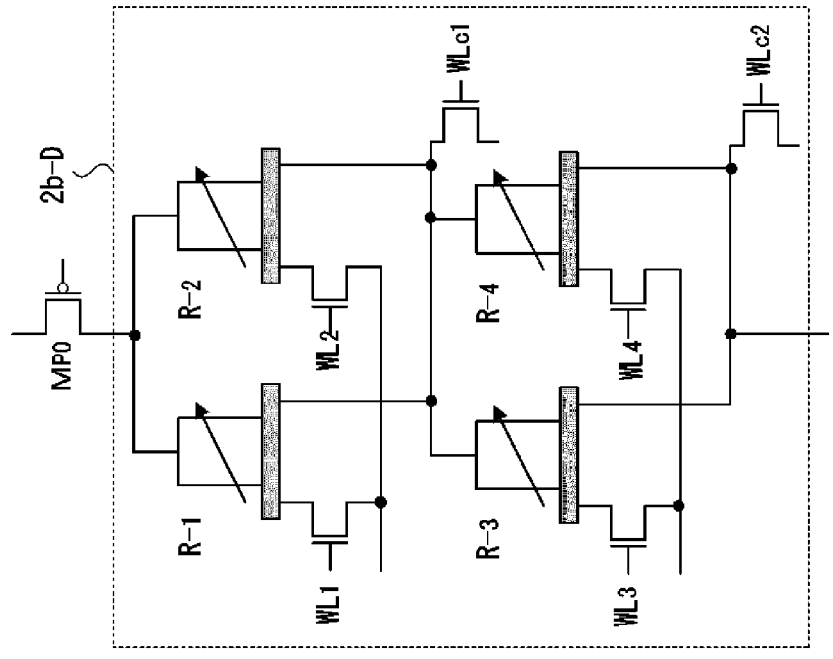
FIG. 8 shows examples of the dynamic load unit with the array structure in which resistive memory elements are connected in series or in series-parallel.
Figure 8:
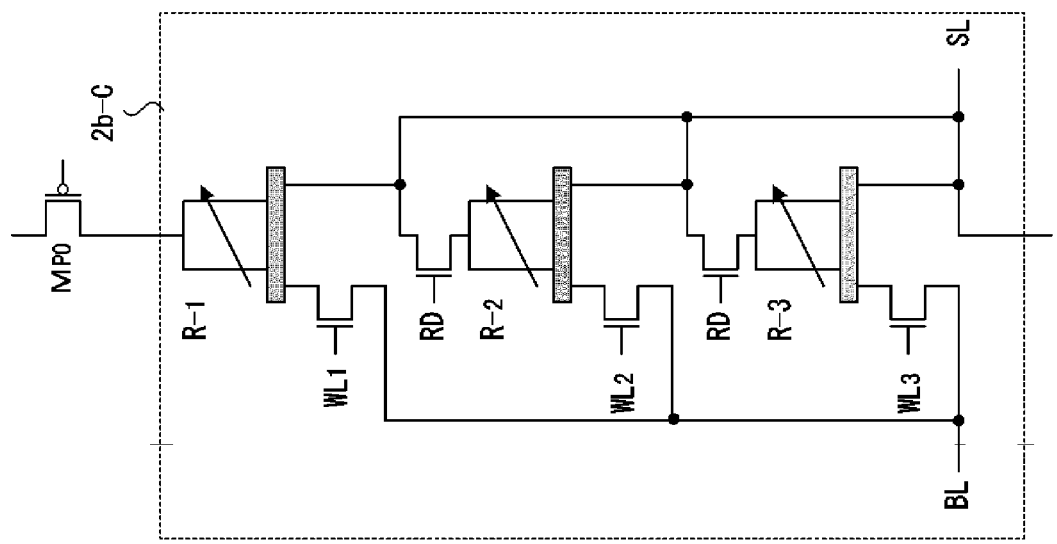
Figure 9:
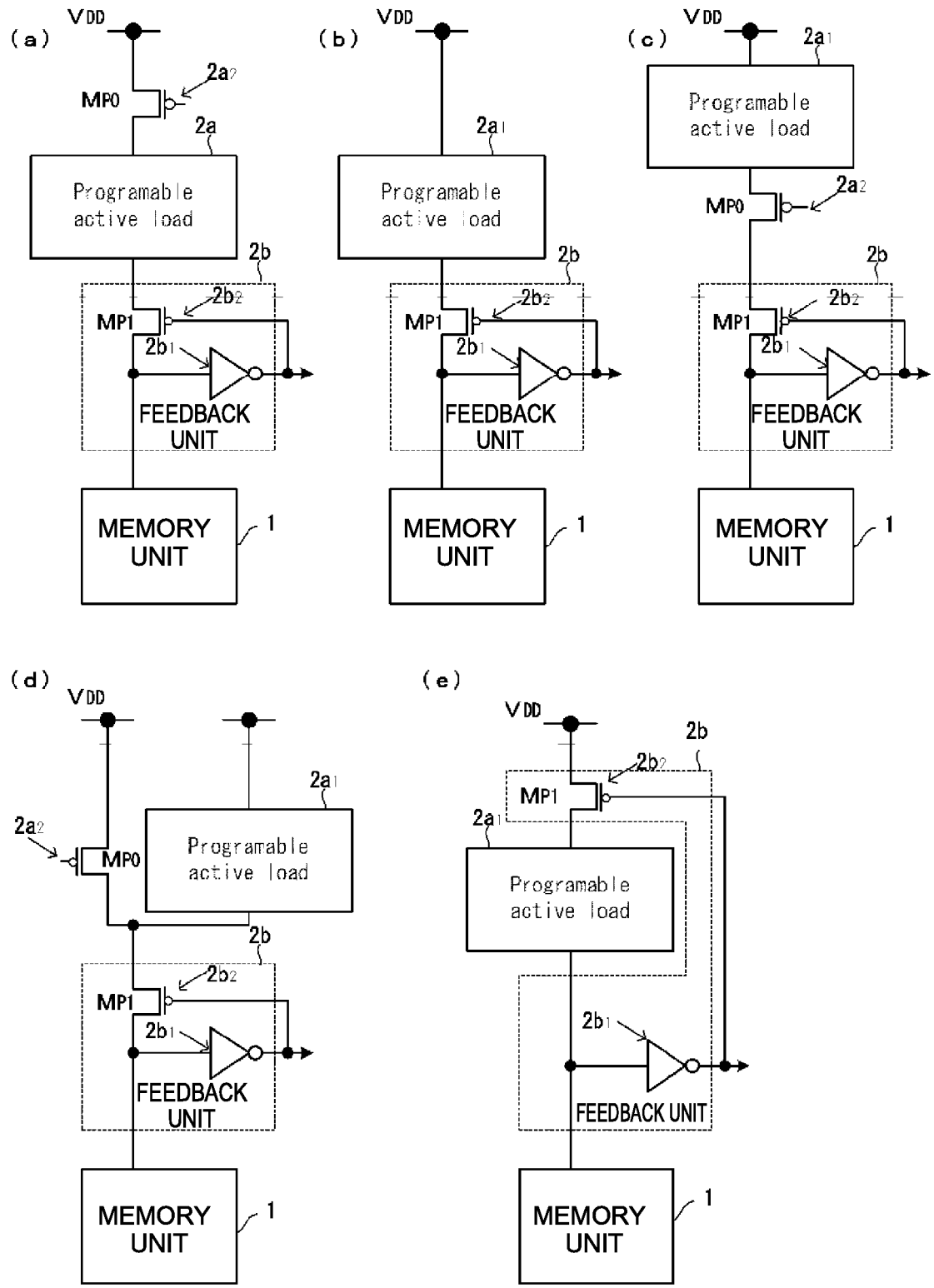
FIG. 9 shows examples of the dynamic load unit and a feedback unit of the read circuit according to the present invention.
Figure 10:
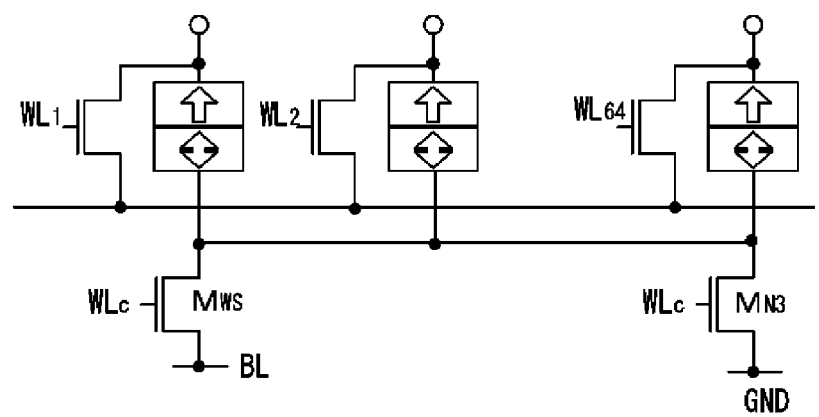
FIG. 10 shows a structure of the memory unit.
Figure 11:
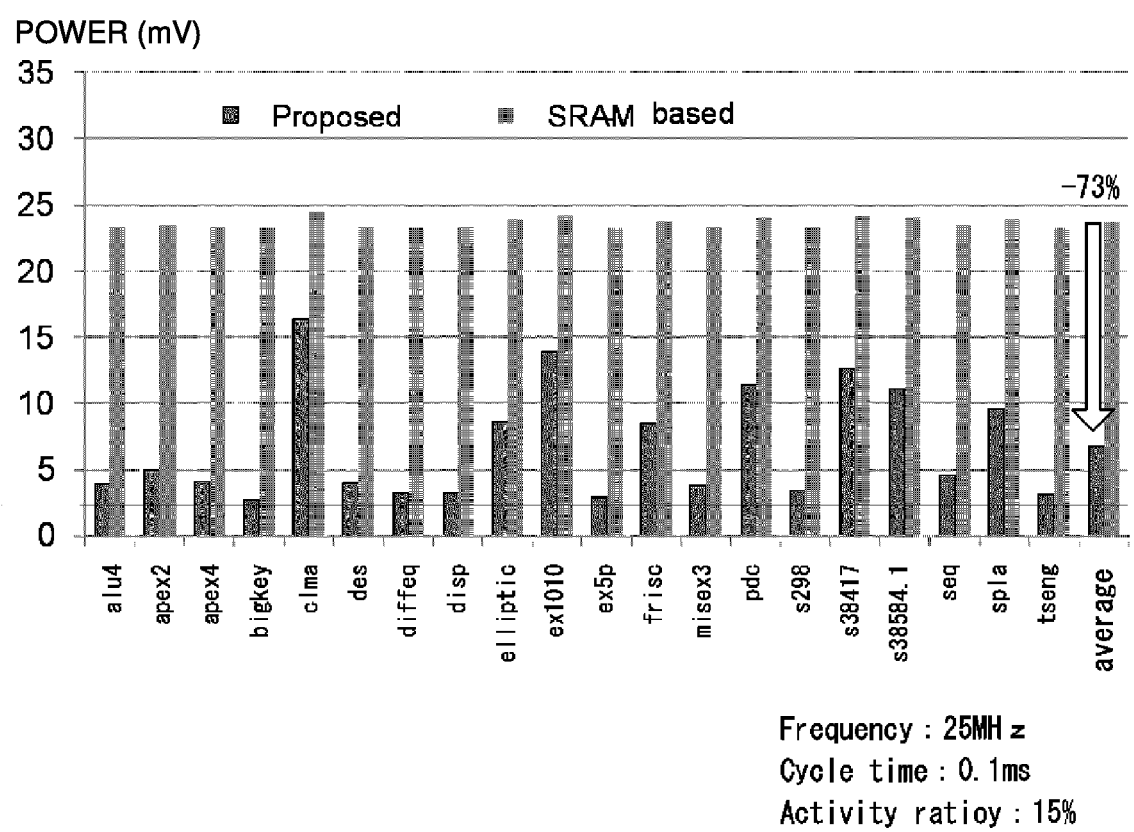
FIG. 11 shows a result of comparing power consumption between the read circuit according to the present invention and a conventional device.
Figure 12:
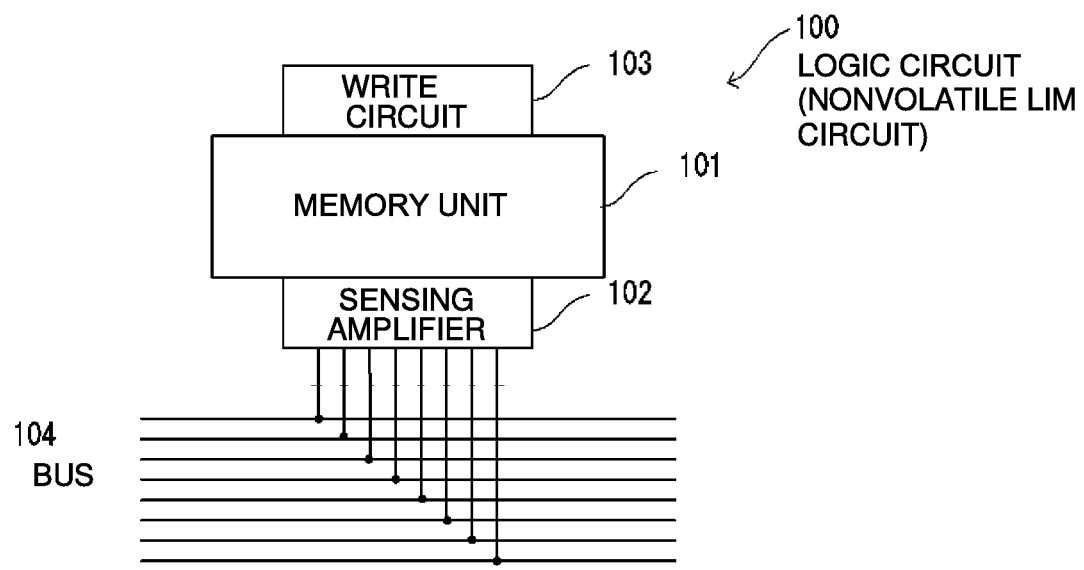
FIG. 12 shows a schematic diagram of a logic circuit.
Figure 13:
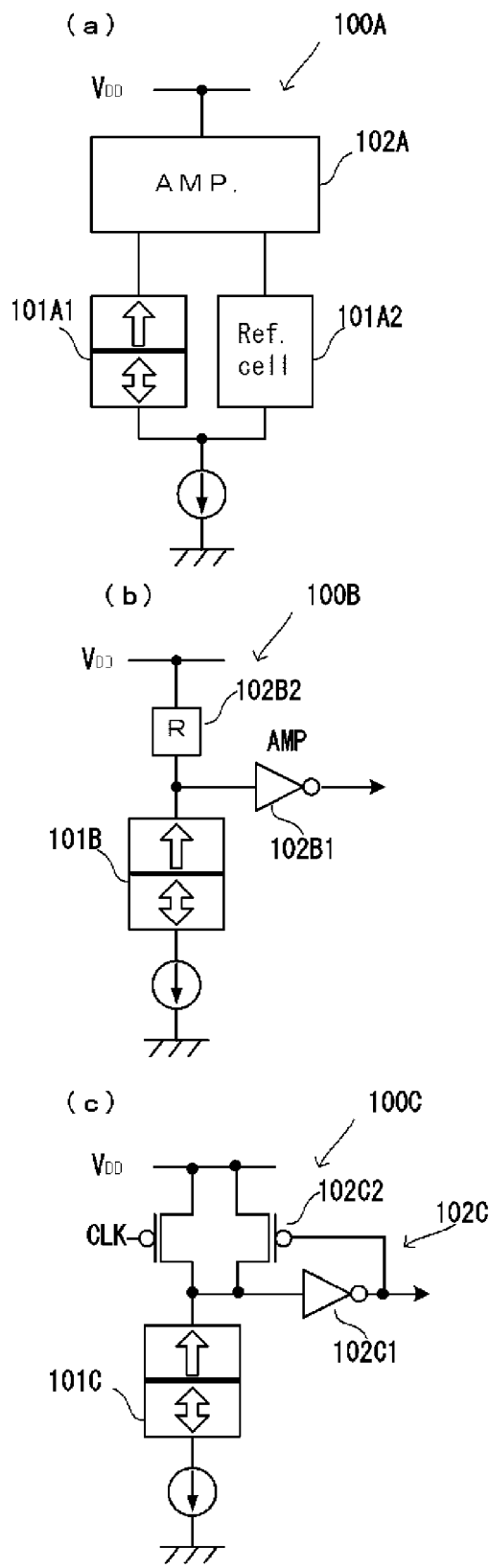
FIG. 13 shows examples of a nonvolatile LIM circuit that has been suggested conventionally, in which the resistive memory element is used.
Figure 14:
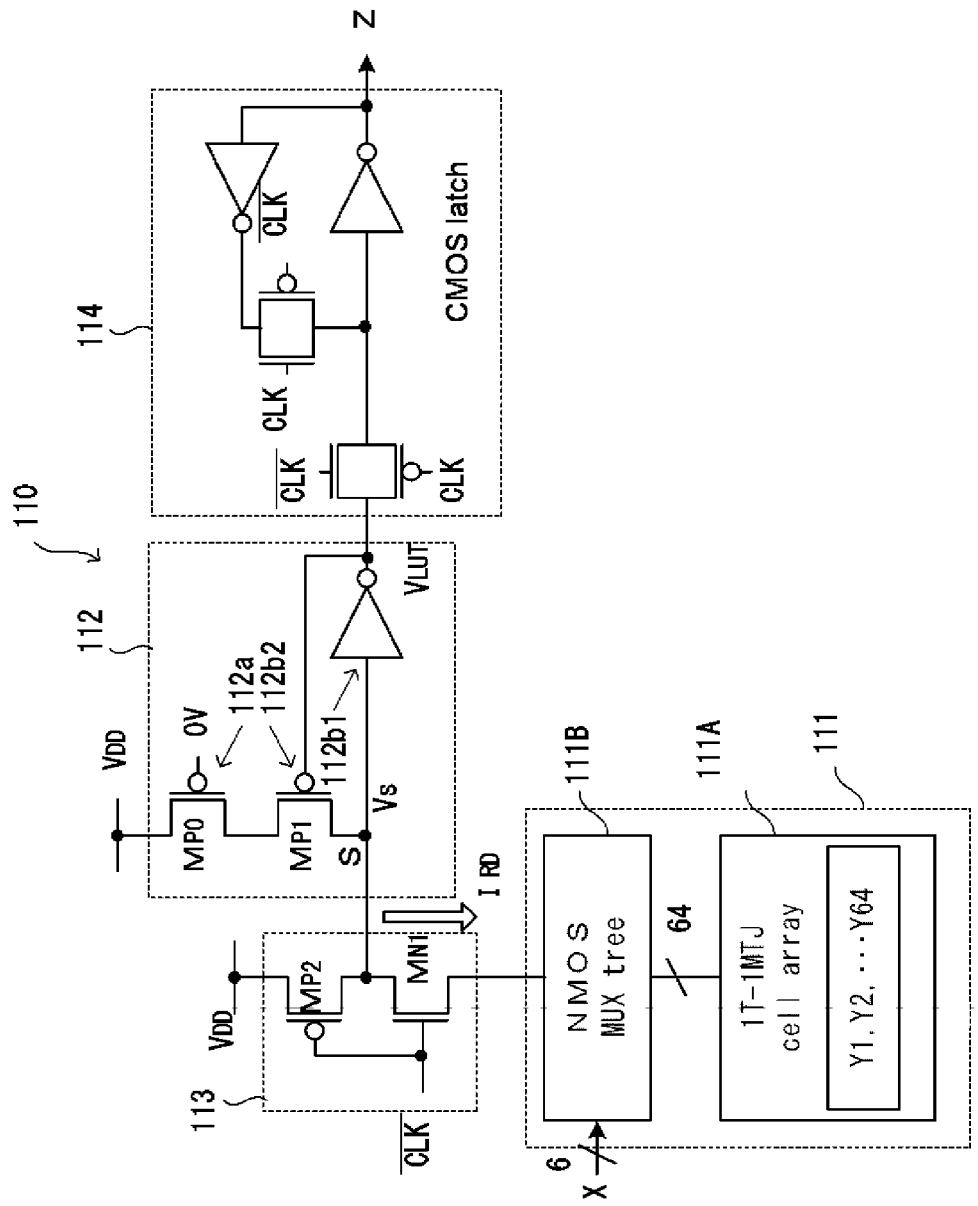
FIG. 14 shows an example of a single ended circuit structure with a feedback.
Figure 15:
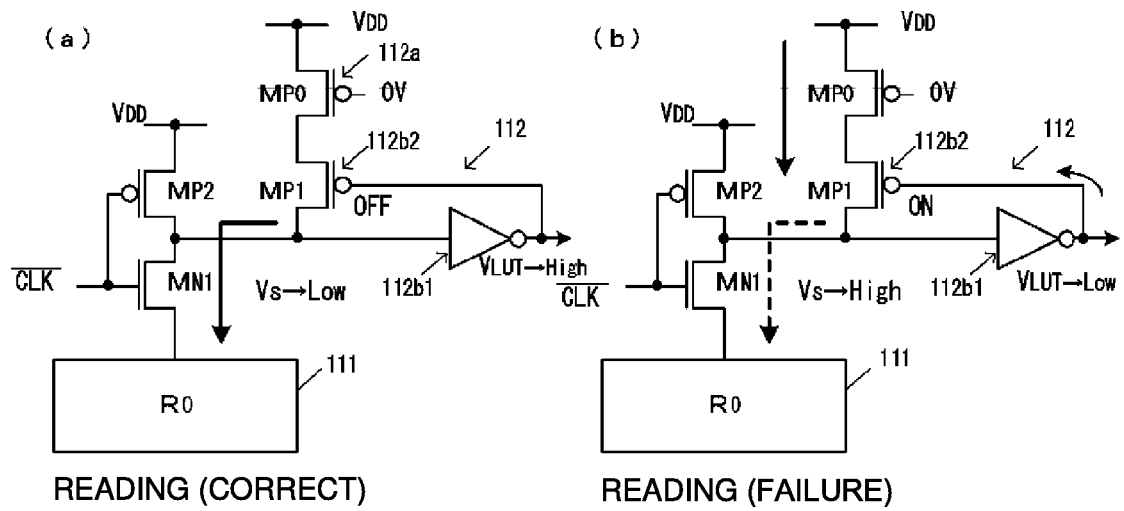
FIG. 15 shows the read operation of the memory unit with a reading unit.
Figure 15:
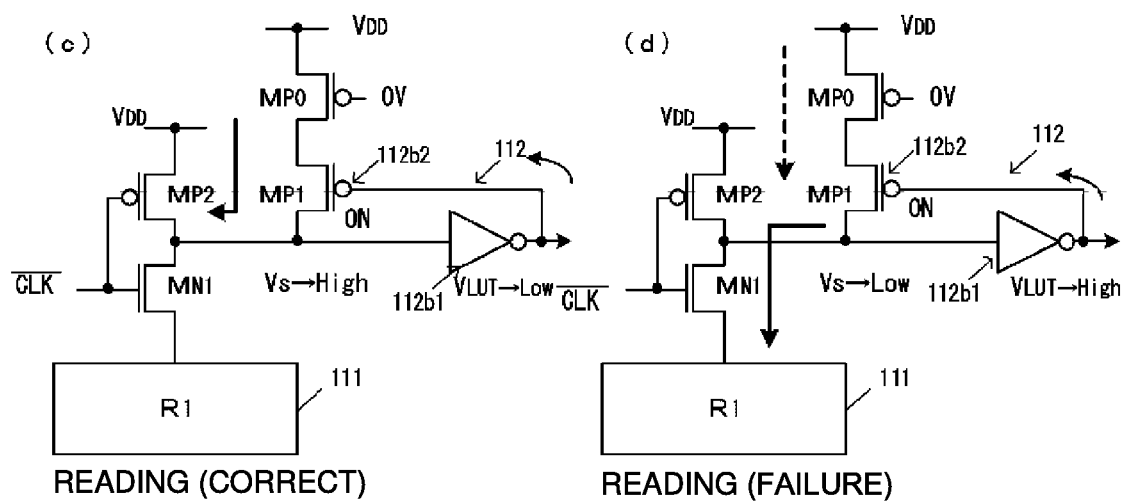

FIG. 1 and FIG. 2 show schematic diagrams of a read circuit and a logic circuit according to the present invention, respectively. FIG. 3 to FIG. 6 show operation examples of the read circuit according to the present invention. FIG. 7 and FIG. 8 show examples of a dynamic load unit with an array structure included in the read circuit according to the present invention. FIG. 9 shows an example of the dynamic load unit and a feedback unit in the read circuit according to the present invention. FIG. 10 shows an example of a memory unit. FIG. 11 shows a result of comparing the power consumption between the read circuit according to the present invention and a conventional circuit.

(Schematic Structure of Read Circuit and Logic Circuit)

FIG. 1 is a schematic structure diagram for describing the read circuit and the logic circuit according to the present invention, and FIG. 2 shows the detailed structure diagram.

The read circuit and the logic circuit according to the present invention include a plurality of structure modes. (a) of FIG. 1 to (d) of FIG. 1, show the detail of each structure mode.

(First Structure Mode)

(a) of FIG. 1 shows a first structure mode of the read circuit and the logic circuit according to the present invention.

The read circuit 2 forms the logic circuit 10 together with a memory unit 1. The logic circuit 10 includes a nonvolatile programmable logic circuit such as a nonvolatile LIM circuit, and includes a programmable logic operating function that enables to structure the logic operation content of the memory unit 1 freely.

The memory unit 1 is composed of a resistive memory element, and stores the logic operation result as a resistance state of high resistance/low resistance of the resistive memory element. The read circuit 2 reads the logic operation result of the memory unit 1 by outputting the resistance state of the memory unit 1 as the high voltage or the low voltage.

The read circuit 2 includes a dynamic load unit 2a that has one end connected to the power supply (VDD) side and the other end connected to the memory unit 1 side, and a feedback unit 2b that outputs to feed back the voltage Vs obtained by the voltage division between the dynamic load unit 2a and the memory unit 1 and holds the voltage Vs obtained by the voltage division.

The dynamic load unit 2a and the memory unit 1 are connected in series, and the power supply voltage VDD is divided in accordance with the resistance ratio between the dynamic load unit 2a and the memory unit 1. The read circuit 2 outputs the voltage Vs obtained by the voltage division from the connection point between the dynamic load unit 2a and the memory unit 1 through the feedback unit 2b. Since the voltage Vs obtained by the voltage division is the voltage according to the logic operation result of the memory unit 1, the logic operation result of the memory unit 1 can be read on the basis of the read voltage Vs obtained by the voltage division.

Here, the dynamic load unit 2a includes an array unit 2a1 in which a plurality of resistive memory elements are connected in series, in parallel, or in series-parallel. The dynamic load unit 2a may have a structure in which a transistor 2a2 is connected in series to the array unit 2a1. Note that the transistor 2a2 may be the PMOS transistor MP0 or an NMOS transistor. In the example to be described below, the PMOS transistor MP0 is used.

Since the dynamic load unit 2a and the memory unit 1 are connected in series, common current flows in both units. The array unit 2a1 and the transistor 2a2, which form the dynamic load unit 2a, and the memory unit 1 each have a nonlinear voltage/current characteristic, and the current that flows to both units is common. Therefore, the voltage Vs obtained by the voltage division, which is obtained by dividing the voltage between the dynamic load unit 2a and the memory unit 1, is determined using, as the operating point, the point where the voltage/current characteristics of both units intersect.

In addition, the voltage/current characteristic of the memory unit 1 is different when the resistance is low and when the resistance is high; therefore, the voltage Vs obtained by the voltage division when the memory unit 1 has the low resistance and the voltage Vs obtained by the voltage division when the memory unit 1 has the high resistance are different voltage levels. From the difference between the voltage levels, the logic operation result in the memory unit 1 can be read.

A semiconductor device such as the resistive memory element or the transistor included in the dynamic load varies in voltage/current characteristic; therefore, the operating point of the series circuit of the dynamic load unit 2a and the memory unit 1 varies.

The dynamic load unit 2a according to the present invention includes the array unit 2a1 in which the resistive memory elements are connected in series, in parallel, or in series-parallel; therefore, the influence of the voltage/current characteristic from each element is reduced and the variation in characteristic is reduced.

The feedback unit 2b is a structure unit that accelerates the change of the voltage Vs obtained by the voltage division and has a function of holding the changed voltage. The feedback unit 2b includes an inverter 2b1 connected to the connection point S between the dynamic load unit 2a and the memory unit 1, and a feedback transistor 2b2 that is provided on the series connection circuit of the dynamic load unit 2a and the memory unit 1. The feedback transistor 2b2 is formed by, for example, the PMOS feedback transistor MP1. In the structure example illustrated in FIG. 1, the inverter 2b1 is connected between a drain end of the feedback transistor 2b2 (MP1) and an output of the inverter, and the output of the inverter is fed back to the gate of the feedback transistor 2b2 (MP1).

The inverter 2b1 controls the on/off state of the feedback transistor 2b2 on the basis of the comparison between the voltage Vs obtained by the voltage division at the connection point S and the threshold voltage VINV of the inverter. For example, if the voltage Vs obtained by the voltage division is the high voltage Vhigh over the threshold voltage VINV, the inverter 2b1 feeds back the inverted low voltage to the feedback transistor 2b2 and keeps the feedback transistor 2b2 on. By this operation, the voltage Vs obtained by the voltage division is held as the high voltage Vhigh.

On the other hand, if the voltage Vs obtained by the voltage division is the low voltage Vlow not over the threshold voltage VINV, the inverter 2b1 feeds back the inverted high voltage to the feedback transistor 2b2 and turns off the feedback transistor 2b2. By this operation, the voltage Vs obtained by the voltage division is dropped to the low voltage Vlow and held.

(Second Structure Mode)

(b) of FIG. 1 illustrates a second structure mode of the read circuit and the logic circuit according to the present invention. The second structure mode is the same as the first structure mode except that the dynamic load unit 2a is formed only by the array unit 2a1.

In the second structure mode, the dynamic load unit 2a is free of the variation in voltage/current characteristic due to the transistor 2a2. Note that the resistance value of the dynamic load unit 2a is determined by the resistance value of the array unit 2a1; therefore, the operating point of the voltage Vs obtained by the voltage division by the series connection between the dynamic load unit 2a and the memory unit 1 is adjusted on the basis of the resistance of the array unit 2a1.

Next, a structure of including a switching unit is described with reference to (c) and (d) of FIG. 1.

A switching unit 3 (3A, 3B) is provided between the feedback unit 2b and the memory unit 1 so as to switch the connection between the power supply voltage VDD and the feedback unit 2b and the connection between the dynamic load unit 2a and the memory unit 1 through the feedback unit 2b.

In the read operation, the switching unit 3 controls the transition of a first operation at an initial stage of the reading and a second operation of reading the logic operation result of the memory unit 1 as the voltage obtained by the voltage division.

The first operation is to connect the power supply voltage VDD and the feedback unit 2b, to stop the reading of the memory unit 1, and to charge the feedback unit 2b with the power supply voltage VDD. By the first operation, the voltage level of the feedback unit 2b is charged to the power supply voltage VDD.

The second operation is to connect the dynamic load unit 2a with the memory unit 1 via the feedback unit 2b. In this connected state, connecting the feedback unit 2b and the memory unit 1, and stopping the charging of the feedback unit 2b with the power supply voltage VDD are performed. By the second operation, the voltage obtained by the voltage division of the dynamic load unit 2a and the memory unit 1 is applied to the feedback unit 2b, and by this voltage obtained by the voltage division, the logic operation result of the memory unit 1 is read.

(Third Structure Mode)

(c) of FIG. 1 illustrates a third structure mode of the read circuit and the logic circuit according to the present invention.

In the third structure mode, the switching unit 3A is connected to the feedback unit 2b and the memory unit 1, and switches the connection of the feedback unit 2b between the power supply voltage VDD and the memory unit 1. If the switching unit 3A is connected to the power supply voltage VDD side, the connection point S of the feedback unit 2b is charged with the power supply voltage VDD. On the other hand, if the switching unit 3A is connected to the memory unit 1, the voltage Vs obtained by the voltage division is generated at the connection point S by the discharging of the charged voltage.

(Fourth Structure Mode)

(d) of FIG. 1 illustrates a fourth structure mode of the read circuit and the logic circuit according to the present invention.

In the fourth structure mode, the switching unit 3B is connected to the feedback unit 2b and the power supply voltage VDD and between the memory unit 1 and a ground node, and switches the connection of the feedback unit 2b, the power supply voltage VDD, and the memory unit 1 and the ground node. If the switching unit 3B is connected to the power supply voltage VDD side, the connection point S of the feedback unit 2b is charged to the power supply voltage VDD. On the other hand, if the switching unit 3B is switched to the ground node, the voltage Vs obtained by the voltage division is generated at the connection point S by the discharging of the charged voltage.

(Structure Example of Read Circuit and Logic Circuit)

FIG. 2 shows an example of the read circuit and the logic circuit. Here, the structure example of the third structure mode is shown in (c) of FIG. 1.

The memory unit 1 performs a logic operating function such as the adder in accordance with truth table configured to the memory elements and also performs the memory function of memorizing the input/output relation. The memory unit 1 can be formed by a cell 1A having the resistive memory elements disposed in an array form, and a selecting unit 1B that selects the resistive memory element in the cell 1A. In the structure example illustrated in FIG. 2, the cell 1A is formed by 64 MTJ devices, and memorizes 64 states of Y1 to Y64. The selecting unit 1B is formed by a tree of NMPS transistors that are selected by 6-bit signal lines, and selects one of the 64 states memorized in the cell 1A. The number of MTJ devices in the cell 1A and the number of bits of the selecting unit 1B are arbitrarily determined, and by correlating the number of MTJ devices in the cell 1A and the number of bits of the selecting unit 1B with each other, the logic operation and the memory capacity of the cell 1A can be effectively utilized.

The read circuit 2 includes the dynamic load unit 2a and the feedback unit 2b. The dynamic load unit 2a is formed by the series connection of the transistor 2a2 and the array unit 2a1 which is formed by the series connection, the parallel connection, or the series-parallel connection of the resistive memory elements.

The feedback unit 2b is formed by the inverter 2b1 and the feedback transistor 2b2. The feedback transistor 2b2 (MP1) has a source connection to the dynamic load unit 2a side and a drain connection to the memory unit 1 side. The point S between the dynamic load unit 2a and the memory unit 1 is connected to the input of the inverter, and the gate of the feedback transistor 2b2 is connected to the output of the inverter.

In the feedback unit 2b, the inverter 2b1 turns on/off the feedback transistor 2b2 (MP1) on the basis of the comparison between the voltage Vs obtained by the voltage division and the threshold voltage VINV of the inverter to accelerate the change of the voltage Vs obtained by the voltage division and holds the changed voltage Vs obtained by the voltage division.

The switching unit 3 forms a series connection circuit by connecting a drain of a PMOS transistor 3a (MP2) and a drain of an NOMS transistor 3b (MN1). The source of the PMOS transistor 3a (MP2) is connected to the power supply voltage VDD side and the source of the NMOS transistor 3b (MN1) is connected to the memory unit 1. An inverted clock signal is applied to a gate of the PMOS transistor 3a (MP2) and a gate of the NMOS transistor 3b (MN1), and by the on/off operations that are performed alternately, charging of the power supply voltage VDD to the connection point S and generation of the voltage Vs obtained by the voltage division by the discharging of the charged voltage are performed alternately.

(Operation Example of Read Circuit)

Figure 3:
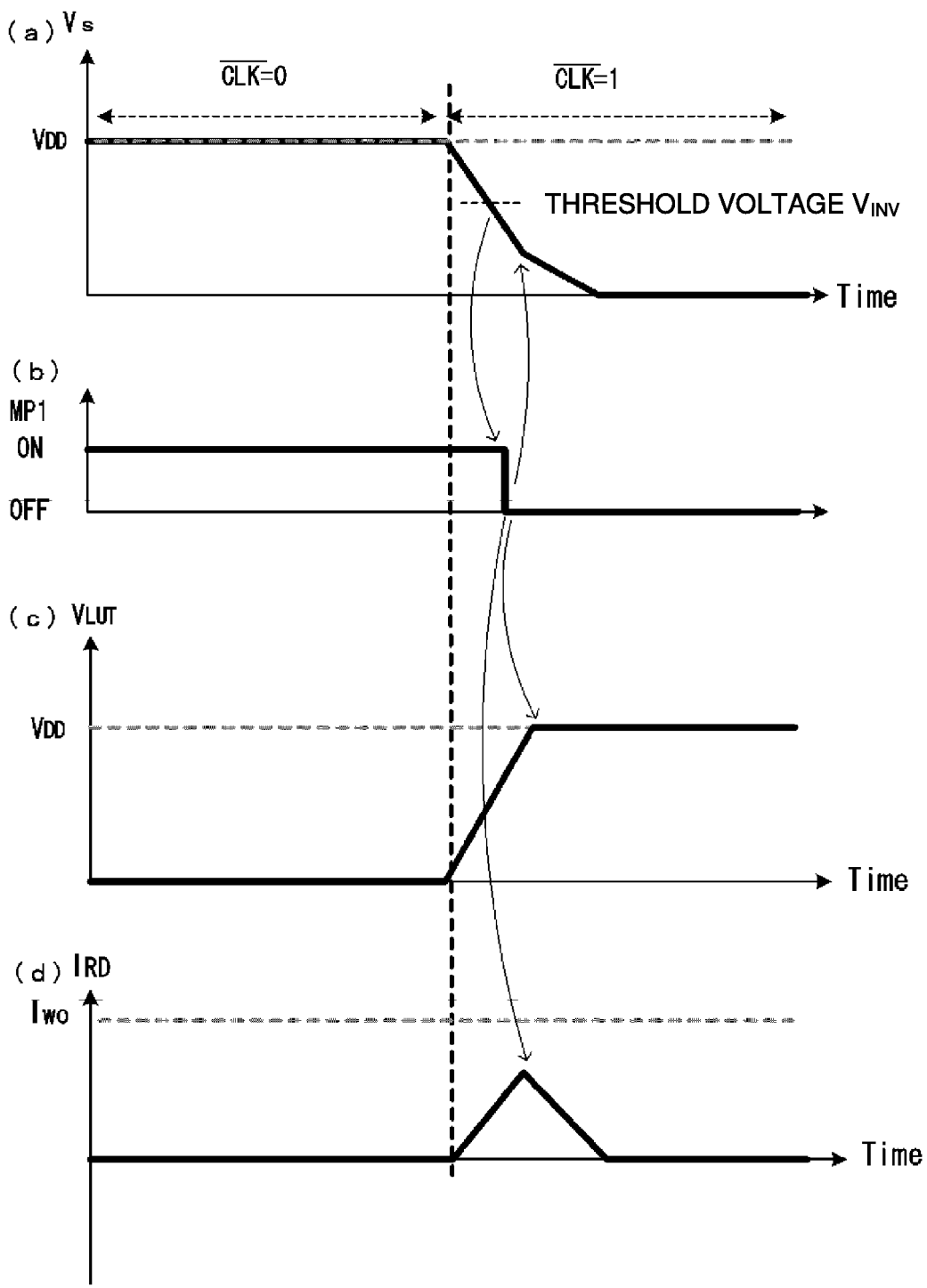
FIG. 3 shows a waveform of the read circuit when a memory unit of the read circuit is in a low resistance state.
Figure 4:
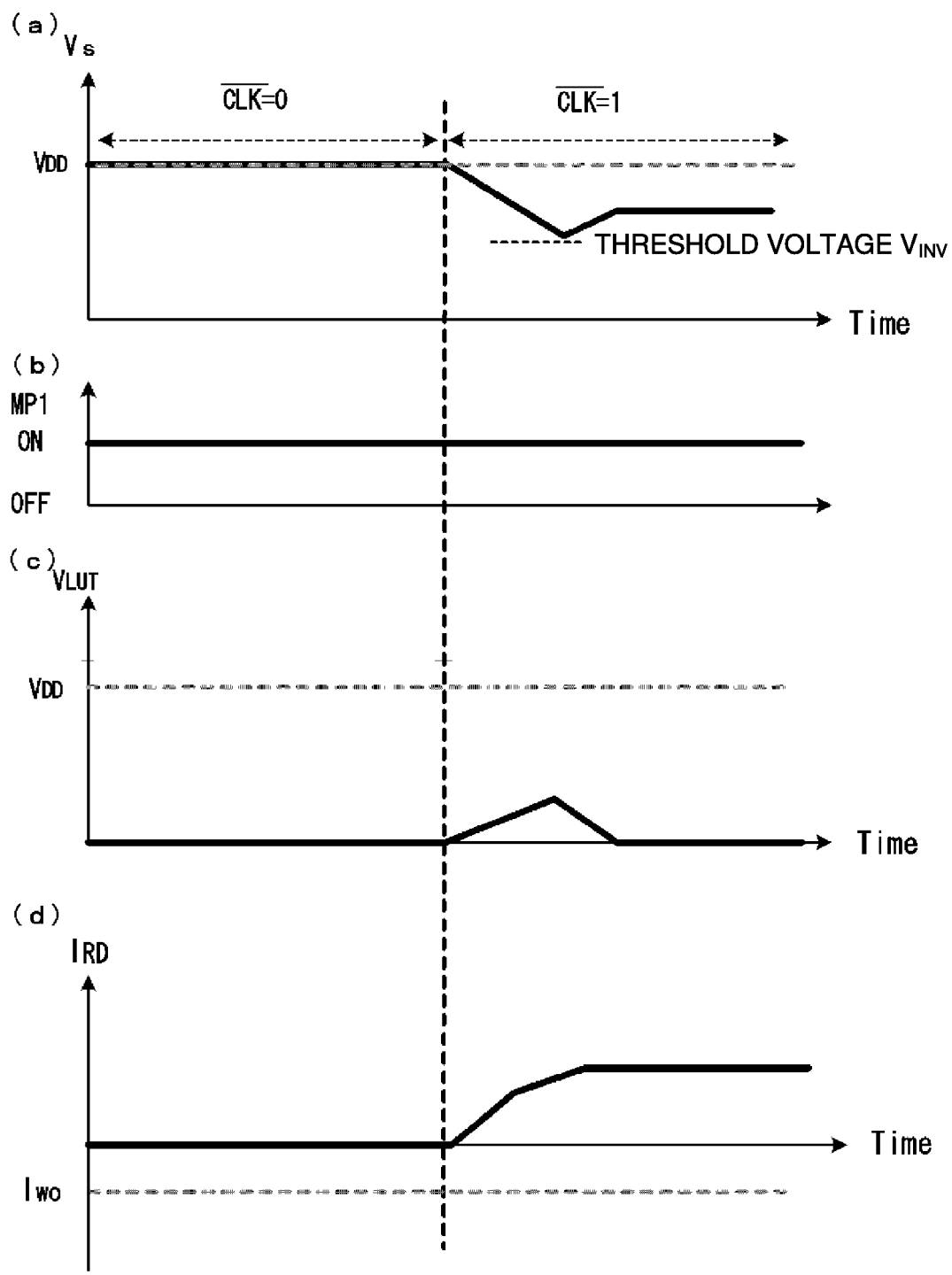
FIG. 4 shows a waveform of the read circuit when the memory unit of the read circuit is in a high resistance state.

Next, an operation example of the read circuit is described. FIG. 3 shows a waveform of the operation example of the read circuit when the memory unit of the read circuit is in the low resistance state, and FIG. 4 shows a waveform of the operation example of the read circuit when the memory unit of the read circuit is in the high resistance state.

(Reading in the Low Resistance State)

(a) to (d) of FIG. 3, in which the memory unit is in the low resistance state, illustrates the voltage Vs obtained by the voltage division, the on/off state of the feedback transistor MP1, the output voltage VLUT of the inverter, and the current IRD in the reading, respectively.

In the initial state, the feedback transistor MP1 is turned on ((b) of FIG. 3). In this state, "0" is applied as a clock inversion signal CLK* (here, the symbol "*" represents an inversion signal) to the switching unit 3, so that the transistor 3a (MP2) is turned on and the transistor 3b (MN1) is turned off and the voltage Vs obtained by the voltage division at the connection point S is charged to the power supply voltage VDD ((a) of FIG. 3). The output voltage VLUT of the inverter 2b1 is in the low voltage state, in which the high voltage state of the voltage Vs obtained by the voltage division at the connection point S is inverted ((c) of FIG. 3), and the reading current IRD does not flow ((d) of FIG. 3).

Next, when the clock inversion signal CLK* to be input to the switching unit 3 is switched from "0" to "1", the transistor MP2 is turned off and the transistor MN1 is turned on, so that the charged voltage of the voltage Vs obtained by the voltage division at the connection point S is discharged from the power supply voltage VDD ((a) of FIG. 3) and the reading current IRD starts to flow ((d) of FIG. 4). The current of the reading current IRD and the voltage Vs obtained by the voltage division change toward the levels based on the resistance of the dynamic load unit 2a and the memory unit 1. While the memory unit 1 is in the low resistance state, the voltage Vs obtained by the voltage division is dropped to the low voltage that is determined based on the state of the voltage obtained by the voltage division of the dynamic load unit 2a and the memory unit 1 ((a) of FIG. 3).

When the voltage Vs obtained by the voltage division has dropped below the threshold voltage VINV of the inverter 2b1, the output of the inverter 2b1 is inverted to the high voltage side, and by feeding back the high voltage, turns off the feedback transistor 2b2 (MP1) ((b) of FIG. 3). As the feedback transistor 2b2 (MP1) is turned off, the voltage Vs obtained by the voltage division is switched to the low voltage quickly and the output voltage of the inverter 2b1 is kept the high.

(Reading in the High Resistance State)

(a) to (d) of FIG. 4, in which the memory unit is in the high resistance state, illustrates the voltage Vs obtained by the voltage division, the on/off state of the feedback transistor 2b2 (MP1), the output voltage VLUT of the inverter, and the current IRD in the reading, respectively.

In the initial state, the feedback transistor 2b2 (MP1) is turned on ((b) of FIG. 4). In this state, "0" is input as a clock inversion signal CLK* (the symbol "*" represents an inversion signal) to the switching unit 3, so that the transistor 3a (MP2) is turned on and the transistor 3b (MN1) is turned off and the voltage Vs obtained by the voltage division at the connection point S is charged to the power supply voltage VDD ((a) of FIG. 4). The output voltage VLUT of the inverter 2b1 is in the low voltage state, in which the high voltage state of the voltage Vs obtained by the voltage division at the connection point S is inverted ((c) of FIG. 4), and the reading current IRD does not flow ((d) of FIG. 4).

Next, when the clock inversion signal CLK* to be input to the switching unit 3 is switched from "0" to "1", the transistor 3a (MP2) is turned off and the transistor 3b (MN1) is turned on, so that the charged voltage of the voltage Vs obtained by the voltage division at the connection point S is discharged from the power supply voltage VDD ((a) of FIG. 4) and the reading current IRD starts to flow ((d) of FIG. 4). The current of the reading current IRD and the voltage Vs obtained by the voltage division transits toward the levels based on the voltage dividing ratio of the resistance of the dynamic load unit 2a and the resistance of the memory unit 1. While the memory unit 1 is in the high resistance state, the voltage Vs obtained by the voltage division is raised to the high voltage that is determined based on the voltage dividing ratio between the dynamic load unit 2a and the memory unit 1 ((a) of FIG. 4).

When the voltage Vs obtained by the voltage division is over the threshold voltage VINV of the inverter 2b1, the inverter 2b1 is inverted to the low voltage side, and by feeding back the low voltage, keeps the feedback transistor 2b2 (MP1) on ((b) of FIG. 4). As the feedback transistor 2b2

(MP1) is turned on, the voltage Vs obtained by the voltage division is kept as the high voltage and the output voltage of the inverter 2b1 is kept as the low voltage.

(Operating Point of Voltage Obtained by Voltage Division and Feedback Operation)

Next, the operating point of the voltage obtained by the voltage division and the feedback operation are described with reference to FIG. 5.

The voltage Vs obtained by the voltage division is determined based on the resistance ratio between the dynamic load unit 2a and the memory unit 1, and its operating point is determined based on the point where the voltage-current characteristic of the dynamic load unit and the voltage-current characteristic of the resistive memory element in the memory unit intersect.

Figure 5:
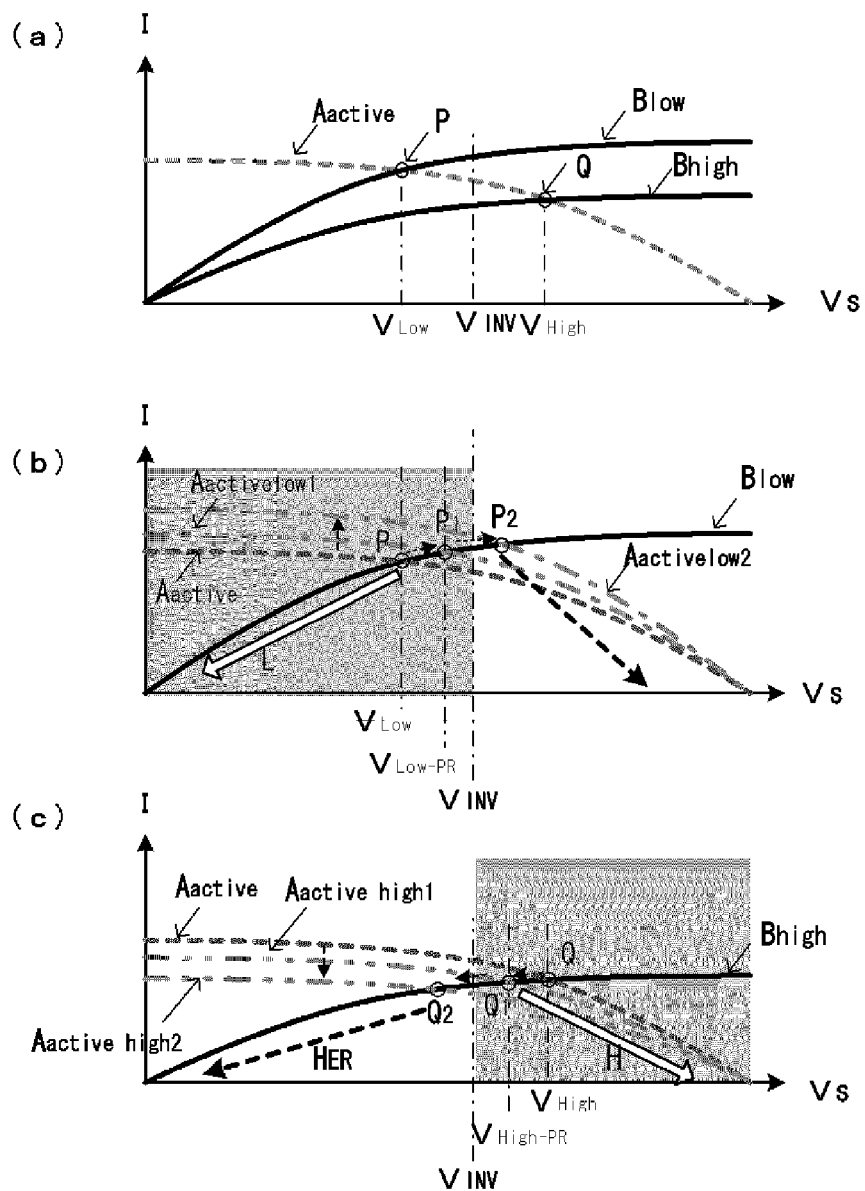
FIG. 5 shows an operating point analysis of a voltage obtained by the voltage division and a feedback operation.

In (a) of FIG. 5, the voltage-current characteristic of the dynamic load unit is shown by Aactive, and the voltage-current characteristic of the memory unit is shown by Blow and Bhigh. Blow indicates the voltage-current characteristic when the memory unit is in the low resistance state, and Bhigh indicates the voltage-current characteristic when the memory unit is in the high resistance state.

If the memory unit 1 is in the low resistance state, the operating point is determined by a point P where the voltage-current characteristic of the dynamic load unit 2a indicated by Aactive and the voltage-current characteristic of the memory unit 1 indicated by Blow intersect. The voltage Vs obtained by the voltage division here is the low voltage Vlow. On the other hand, if the memory unit 1 is in the high resistance state, the operating point is determined by a point Q where the voltage-current characteristic of the dynamic load unit 2a indicated by Aactive and the voltage-current characteristic of the memory unit 1 indicated by Bhigh intersect. The voltage Vs obtained by the voltage division here is the high voltage Vhigh.

In order to drive the feedback circuit by the level of the voltage level of the voltage Vs obtained by the voltage division, it is necessary that, with respect to the threshold voltage VINV of the inverter, the voltage Vs obtained by the voltage division at the low resistance is on the low voltage Vlow side and the voltage Vs obtained by the voltage division at the high resistance is on the high voltage Vhigh side. (a) of FIG. 5 shows the relation between the voltage Vs obtained by the voltage division and the threshold voltage VINV of the inverter.

Figure 16:
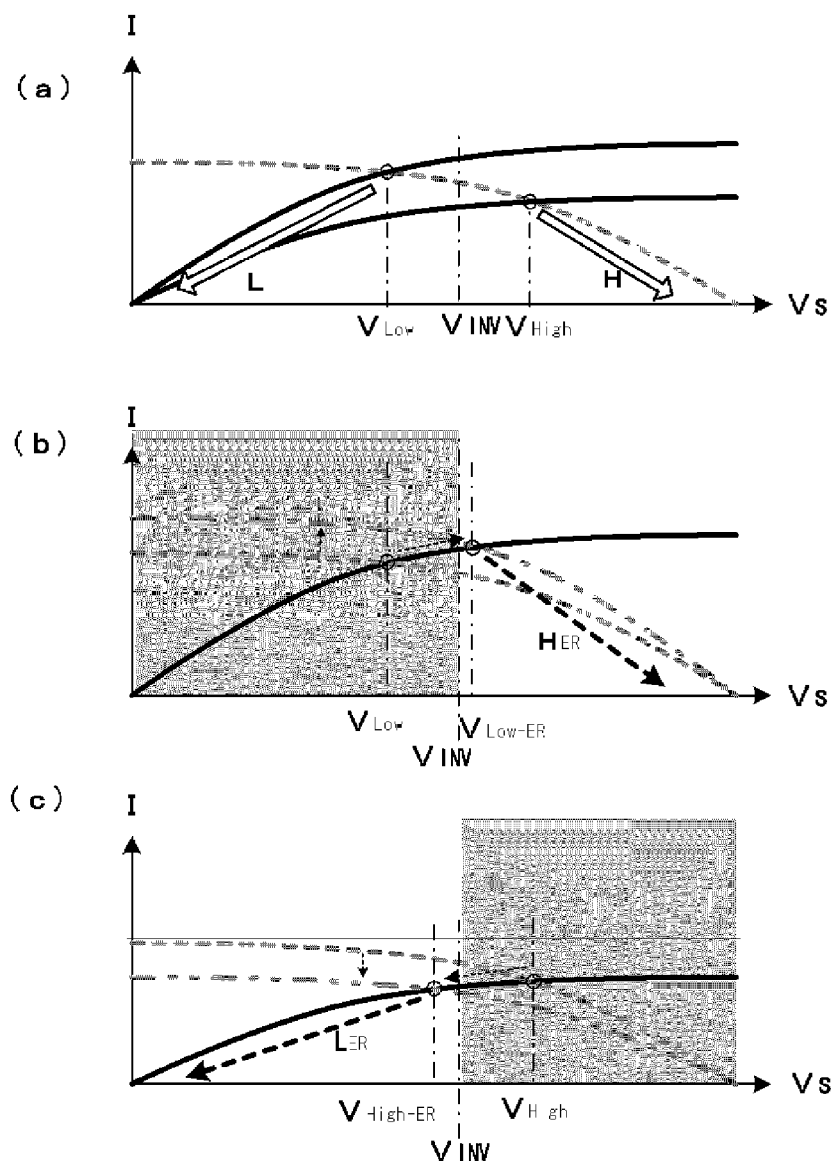
FIG. 16 shows the relation between a voltage Vs obtained by the voltage division and a threshold voltage VINV of an inverter and a read failure operation due to the variation in dynamic load.
Figure 17:
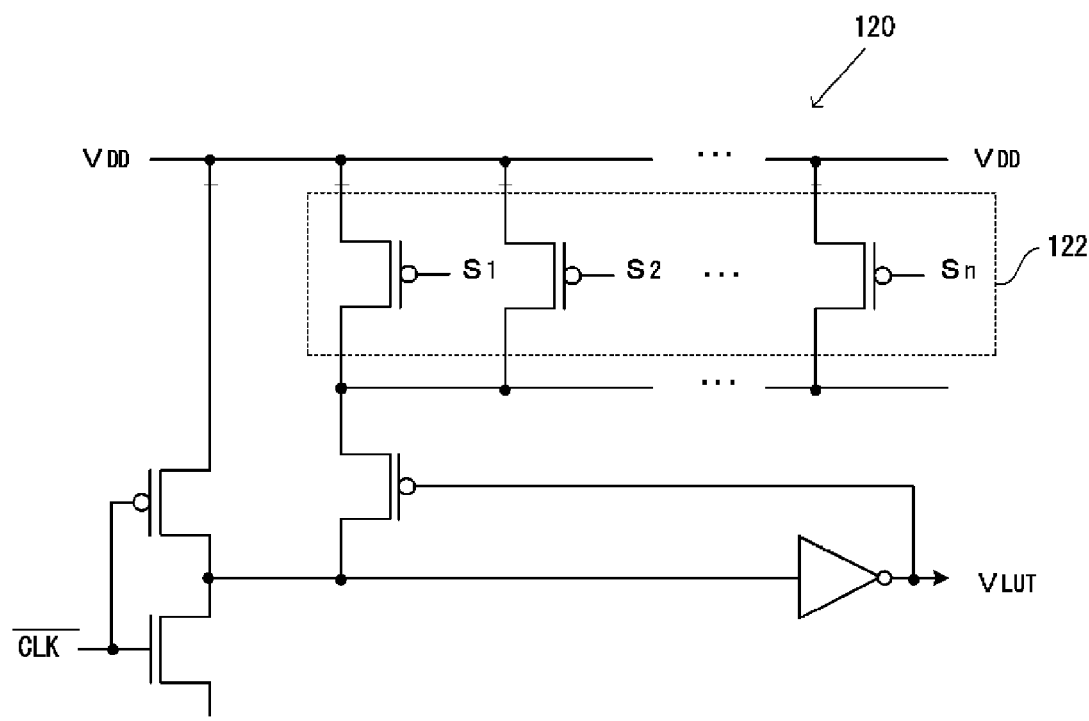
FIG. 17 shows one example of a reading circuit in which a PMOS transistor is selectable.

FIG. 16 shows the incorrect operation due to the variation in characteristic of the dynamic load. For the incorrect operation due to the variation in characteristic of the dynamic load, the action of suppressing the incorrect operation by forming the resistive memory elements in the dynamic load unit according to the present invention as the array structure is described with reference to (b) and (c) of FIG. 5. (b) of FIG. 5 illustrates the operation at the low resistance, and (c) of FIG. 5 illustrates the operation at the high resistance.

(Operation at Low Resistance)

In (b) of FIG. 5, the voltage-current characteristic in the case where the dynamic load does not vary at the low resistance is indicated by a dashed line Aactive, and the voltage-current characteristic in the case where the dynamic load varies is indicated by dot-chain lines Aactive-low1 and Aactive-low2.

Aactive-low1 indicates the variation state of the dynamic load according to the present invention in which the resistive memory elements are formed as the array structure, and Aactive-low2 indicates the variation state of the dynamic load that is not according to the present invention, the variation is caused by the variation in characteristic of the semiconductor elements included in the dynamic load unit.

If the dynamic load varies due to the variation in characteristic of the semiconductor element not in accordance with the present invention, the characteristic varies largely; therefore, an intersection P2 between Aactive-low2 and the voltage-current characteristic Blow is more on the high voltage side than the threshold voltage VINV of the inverter. Therefore, the voltage Vs obtained by the voltage division changes toward the high voltage side by the inverter operation (dashed line arrow in (b) of FIG. 5) and this results in the read failure.

On the other hand, in the case of the dynamic load in which the resistive memory elements are formed as the array structure in accordance with the present invention, the variation in characteristic is small even when the dynamic load varies. Therefore, an intersection P1 between Aactive-low1 and the voltage-current characteristic Blow is more on the low voltage side than the threshold voltage VINV of the inverter, and thus, the voltage Vs obtained by the voltage division changes to the low voltage side by the inverter operation (solid line arrow in (b) of FIG. 5), and this results in the correct reading.

In (b) of FIG. 5, the voltage range shown by a shaded pattern corresponds to the area where the voltage Vs obtained by the voltage division is lower than the threshold voltage VINV of the inverter. If the variation of the voltage obtained by the voltage division due to the dynamic load is in this voltage range in the operation at the low resistance, the correct reading is performed. On the other hand, if the variation of the voltage obtained by the voltage division due to the dynamic load is out of this voltage range, the read failure occurs. Regarding the dynamic load with the resistive memory elements as the array structure according to the present invention, the read failure is suppressed because the variation in characteristic is suppressed to make the voltage obtained by the voltage division within this voltage range.

(Operation at High Resistance)

In (c) of FIG. 5, the voltage-current characteristic in the case where the dynamic load does not vary at the high resistance is indicated by a dashed line Aactive, and the voltage-current characteristic in the case where the dynamic load varies is indicated by two-dot-chain lines Aactive-high1 and Aactive-high2.

Aactive-high1 indicates the variation state of the dynamic load according to the present invention in which the resistive memory elements are formed as the array structure, and Aactive-high2 indicates the variation state of the dynamic load that is not in accordance with the present invention, the variation being caused by the variation in characteristic of the semiconductor elements included in the dynamic load unit.

If the dynamic load varies due to the variation in characteristic of the semiconductor elements not in accordance with the present invention, the characteristic varies largely; therefore, an intersection Q2 between Aactive-high2 and the voltage-current characteristic Bhigh is more on the low voltage side than the threshold voltage VINV of the inverter. Therefore, the voltage Vs obtained by the voltage division changes toward the high voltage side by the inverter operation (dashed line arrow in (c) of FIG. 5) and this results in the read failure.

On the other hand, in the case of the dynamic load in which the resistive memory elements are formed as the array structure in accordance with the present invention, the variation in characteristic is small even when the dynamic load varies. Therefore, an intersection Q1 between Aactive-high1 and the voltage-current characteristic Bhigh is more on the high voltage side than the threshold voltage VINV of the inverter, and thus, the voltage Vs obtained by the voltage division changes to the high voltage side by the inverter operation (solid line arrow in (c) of FIG. 5), and this results in the correct reading.

In (c) of FIG. 5, the voltage range shown by a shaded pattern corresponds to the area where the voltage Vs obtained by the voltage division is higher than the threshold voltage VINV of the inverter. If the variation of the voltage obtained by the voltage division due to the dynamic load is in this voltage range in the operation at the high resistance, the correct reading is performed. On the other hand, if the variation of the voltage obtained by the voltage division due to the dynamic load is out of this voltage range, the read failure occurs. Regarding the dynamic load with the resistive memory elements as the array structure in accordance with the present invention, the read failure is suppressed because the variation in characteristic is suppressed to make the voltage obtained by the voltage division within this voltage range.

(Simulation Example of the Operation)

Figure 6:
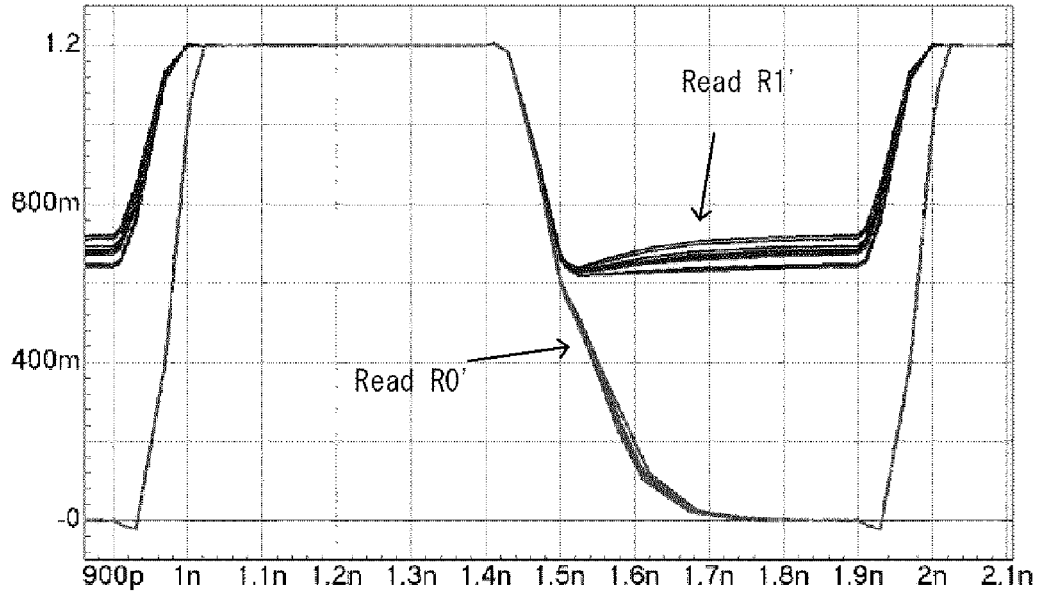
FIG. 6 shows a simulated waveform of the read circuit.
Figure 6:
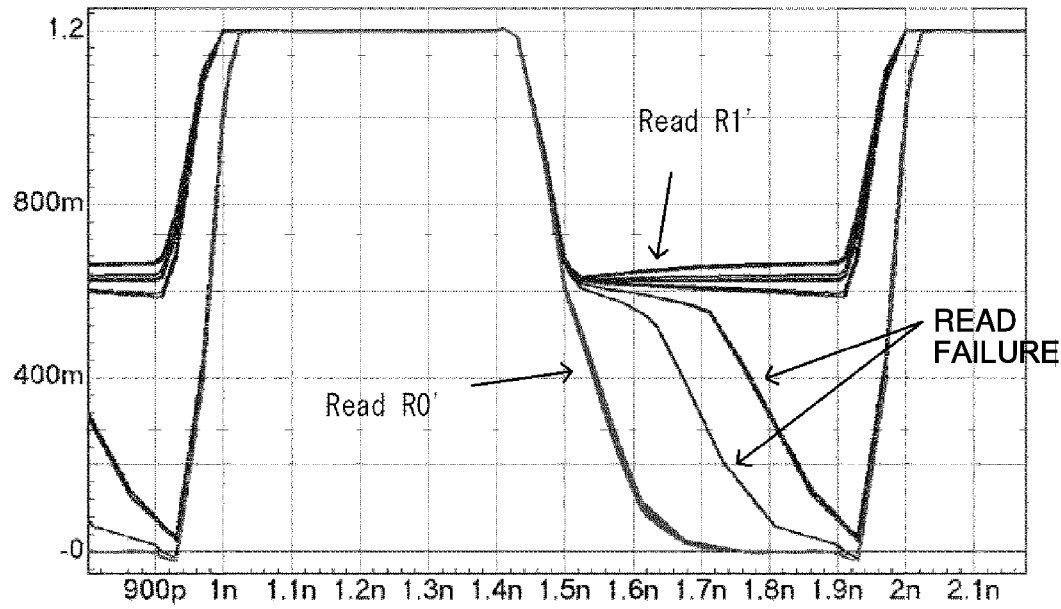

FIG. 6 shows a simulated example of the read circuit. (a) of FIG. 6 shows the state in which the reading has been successfully performed, and (b) of FIG. 6 shows the state in which the reading has failed.

In FIG. 6, "R0" indicates the voltage Vs obtained by the voltage division in the case where the memory unit is in the low resistance state, and "R1" indicates the voltage Vs obtained by the voltage division in the case where the memory unit is in the high resistance state. In (b) of FIG. 6, the read failure part corresponds to the variation state of the voltage Vs obtained by the voltage division due to the variation in characteristic of the dynamic load.

(Array Structure Example of Dynamic Load Unit)

FIG. 7 and FIG. 8 show a structure example of the dynamic load unit with the array structure included in the read circuit according to the present invention is described.

(Parallel Connection)

FIG. 7 shows one example of the dynamic load unit with the array structure in which the resistive memory elements are connected in parallel.

(a) of FIG. 7 illustrates a structure example in which resistive memory elements R-1, R-2, and R-3 including three terminals are connected in parallel. The resistive memory element is, for example, a memory element with the variable resistance including a conductive electrode at one end and a reading electrode at the other end. The resistance change occurs when writing current is applied to the conductive electrode.

(c) of FIG. 7 is a timing chart of the parallel connection example illustrated in (a) of FIG. 7. Writing transistors are provided between the conductive electrodes of the resistive memory elements R-1, R-2, and R-3 and a writing line BL, and are driven sequentially by writing signals WL1 to WL3. The writing signals WL1 and WL2 in (c) of FIG. 7 write the resistive memory elements R-1 and R-2 on one resistance value side of the high resistance or the low resistance, and the writing signal WL3 writes the resistive memory element R-3 on a resistance value side that is different from that of the resistive memory elements R-1 and R-2.

(b) of FIG. 7 illustrates a structure example in which resistive memory elements including two terminals are connected in parallel. The resistive memory element includes, for example, a tunnel barrier layer between a magnetization fixed layer and a magnetization free layer. The resistance change occurs when writing current is applied to the magnetization fixed layer or the magnetization free layer. The number of resistive memory elements to be connected in parallel can be determined arbitrarily.

In the structure example illustrated in (b) of FIG. 7, in the case of using as the dynamic load, WLc, WL1, WL2, and WL3 are the low voltage (Low) and RD is the high voltage (High). Thus, the resistive memory elements R-1 to R-3 can be connected in parallel.

In the writing of the resistive memory elements R-1 to R-3, WLc is the high voltage (High), the WL (WL1, WL2, WL3) of the resistive memory element for a write target is the high voltage (High), and the write current is applied from BL or a BLb.

(Series Connection)

(a) of FIG. 8 shows one example of the dynamic load unit with the array structure in which the resistive memory elements are connected in series. (a) of FIG. 8 illustrates a structure example in which resistive memory elements R-1, R-2, and R-3 including three terminals are connected in series. The resistive memory element is, for example, a memory device with the variable resistance including a conductive electrode at one end and a reading electrode at the other end. The resistance change occurs when writing current is supplied to the conductive electrode. Although (a) of FIG. 8 illustrates the example in which the resistive memory elements including three terminals are used as the resistive memory elements, the resistive memory elements including two terminals may be used. The number of resistive memory elements to be connected in series can be determined arbitrarily.

(Series-Parallel Connection)

(b) of FIG. 8 shows one example of the dynamic load unit with the array structure in which the resistive memory elements are connected in series-parallel. (b) of FIG. 8 illustrates a structure example in which the resistive memory elements R-1, R-2, R-3, and R-4 including three terminals are used and the parallel connection between R-1 and R-2 and the parallel connection between R-3 and R-4 are connected in series. The resistive memory element is, for example, a memory element with the changeable resistance including a conductive electrode at one end and a reading electrode at the other end. The resistance change occurs when writing current is supplied to the conductive electrode. Although (b) of FIG. 8 illustrates the example in which the resistive memory elements including three terminals are used as the resistive memory elements, the resistive memory elements including two terminals may be used. The number of resistive memory elements to be connected in series-parallel and the connection structure can be determined arbitrarily.

(Example of Dynamic Load Unit and Feedback Unit)

FIG. 9 shows a connection example of each part in the structure example of the dynamic load unit and the feedback unit.

In (a) of FIG. 9, the dynamic load unit 2*a* is formed by the series connection circuit of the transistor 2*a*2 (PMOS transistor MP0) and the array unit 2*a*1 including the array structure of the resistive memory elements, and the transistor 2*a*2 (PMOS transistor MP0), the array unit 2*a*1, the feedback unit 2*b*, and the memory unit 1 are connected in series to the power supply voltage VDD.

In (b) of FIG. 9, the dynamic load unit 2*a* is formed by the array unit 2*a*1 with the array structure of the resistive memory elements, and the dynamic load unit 2*a*, the feedback unit 2*b*, and the memory unit 1 are connected in series to the power supply voltage VDD.

In (c) of FIG. 9, the dynamic load unit 2a is formed by the series connection circuit of the array unit 2a1 including the array structure of the resistive memory elements and the transistor 2a2 (PMOS transistor MP0), and the array unit 2a1, the transistor 2a2 (PMOS transistor MP0), the feedback unit 2b, and the memory unit 1 are connected in series to the power supply voltage VDD.

In (d) of FIG. 9, the dynamic load unit 2a is formed by the parallel connection of the transistor 2a2 (PMOS transistor MP0) and the array unit 2a1 including the array structure of the resistive memory elements, and the parallel connection of the transistor 2a2 (PMOS transistor MP0) and the array unit 2a1, the feedback unit 2b, and the memory unit 1 are connected in series to the power supply voltage VDD.

In (e) of FIG. 9(e), the dynamic load unit 2a includes the array unit 2a1 including the array structure of the resistive memory elements, and the feedback transistor 2b2 (MP1) in the feedback unit 2b is connected to the power supply voltage VDD side, and the feedback transistor 2b2 (MP1), the array unit 2a1, the inverter 2b1 of the feedback unit 2b, and the memory unit 1 are connected in series to the power supply voltage VDD.

(Structure Example of Memory Unit)

FIG. 10 shows a structure example of the memory unit. In the structure example illustrated in FIG. 10, the memory unit 1 is, for example, formed by the parallel connection of the resistive memory elements. FIG. 10 illustrates the structure in which 64 resistive memory elements are connected in parallel. The resistive memory elements perform the writing operation by driving the writing transistors provided respectively with writing signals WL1 to WL64.

The structure example in FIG. 10 is just one example and the structure is not limited to this example. The number of resistive memory elements is not limited to 64.

(Result of Comparing Power Consumption Between Read Circuit According to the Present Invention and Conventional Device)

FIG. 11 shows a result of comparing the power consumption between the read circuit according to the present invention and the conventional device. FIG. 11 shows the result of comparing the power consumption between the read circuit according to the present invention and the conventional device and the power consumption of the read circuit according to the present invention is shown by "Proposed" and the power consumption of the conventional device is shown by "SRAM based".

This example employs 20 kinds of benchmarks in the simulation based on Verilog, in which the clock frequency is 25 MHz, the cycle period is 0.1 ms, and the use ratio (Activity ratio) is 15%. According to these simulations, the average reduction ratio of the power consumption achieved by the structure of the present invention is 73%.

Table 1 shows four kinds of comparisons among the circuit structure by CMOS and SRAM (90-nm technique) and three kinds of circuit structures based on the nonvolatile logic-in-memory circuit (LIM) technique regarding a 6-input lookup table (LUT) circuit. As the examples of the three kinds of LIM structures, a differential structure, a single-ended (conventional) structure, and a single-ended (Proposed) structure are shown.

The comparison table shows the effect of reducing the delay time and the power consumption by the single-ended (Proposed) structure according to the present invention.

TABLE 1

| | CMOS & SRAM | Differential | LIM Single-ended (Conventional) | Single-ended (Proposed) |
|---|---|---|---|---|
| Transistor counts | 515 | 273 | 202 | 210 |
| Worst delay [ps] [1] | 152 | 155 | 287 | 153 |
| Dynamic power @1 GHz [vW] [1] | 32.5 | 26.1 | 27.8 | 18.2 |
| Power-delay product [ps · vW] | 4940 | 4046 | 7979 | 2736 |

[1] A 90 - nm CMOS technology ($V_{DD}$: 1.2 V, Temperature: 27° C.)

Table 2 shows results of the Monte Carlo simulation of the incorrect operation in each combination of thresholds of the PMOS transistors and the NMOS transistors in the logic circuit including the MTJ device as the resistive memory element. Here, the deviation of the low resistance R0 at 27° C. is 3% and TMR is 1.5 and the deviation is 3%. TMR is defined as (R1−R0)/R0 when R0 is the low resistance and R1 is the high resistance.

TABLE 2

| | Read failure ratio | | | | |
|---|---|---|---|---|---|
| | SS | SF | TT | FS | FF |
| Without redundant MTJ device | 0% | 100% | 0% | 35% | 0% |
| With redundant MTJ device (proposed) | 0% | 0% | 0% | 0% | 0% |

Temperature: 27° C.
Standard deviation of
$R_0$: 3%
$R_0$: 6 kv
Standard deviation of
TMR ratio: (*):3%
TMR: 1.5
(*)TMR is defined as $(R_1 - R_0)/R_0$ In Table 2, "SS" corresponds to the case in which the threshold of PMOS is high and the threshold of NMOS is high, "SF" corresponds to the case in which the threshold of PMOS is high and the threshold of NMOS is low, "TT" corresponds to the case in which the threshold of PMOS and the threshold of NMOS are medium, "FS" corresponds to the case in which the threshold of PMOS is low and the threshold of NMOS is high, and "FF" corresponds to the case in which the threshold of PMOS is low and the threshold of NMOS is low.

The result shown in the upper column "without redundant MTJ device" in Table 2 corresponds to the read failure ratio by the conventional structure. On the other hand, the result shown in the lower column "without redundant MTJ device (proposed)" in Table 2 corresponds to the read failure ratio by the MTJ structure according to the present invention.

The comparison results shown in Table 2 indicate that the read failure ratio is reduced to 0% in the "SF" and "FS" structures.

Note that the present invention is not limited to the embodiments described above. Various modifications are possible based on the concept of the present invention, and these modifications are not excluded from the scope of the present invention.

INDUSTRIAL APPLICABILITY

The read circuit according to the present invention is applicable to, in addition to the logic circuit, a device utilizing the resistance change and a device structure that reads the resistance state by voltage conversion.

REFERENCE SIGNS LIST

1 Memory unit
1A Cell
1B Selecting unit
2 Read circuit
2a Dynamic load unit
2a1 Array unit
2a2 Transistor
2b Feedback unit
2b1 Inverter
2b2 Feedback transistor
3a Transistor
3b Transistor
10 Logic circuit
100, 100A, 100B, 100C Logic circuit (nonvolatile LIM circuit)
101 Logic unit
101A1 Resistive memory element
101A2 Reference resistor
101B Resistive memory element
102 Amplifier
102B1 Inverter
102B2 Output load
102C Reading circuit
102C1 Inverter
102C2 Feedback transistor
103 Write circuit
104 Bus
110 Logic circuit (nonvolatile LIM circuit)
111 Memory unit
111A Cell
111B Selecting unit
112 Reading unit
112a Dynamic load
112b Feedback circuit
112b1 Inverter
112b2 Feedback transistor
113 Switching unit
114 Latch
120 Logic circuit (nonvolatile LIM circuit)
122 Reading circuit
MN1 NMOS transistor
MP0, MP1, MP2 PMOS transistor
R0 Low resistance
R1 High resistance
R-1 to R-3 Resistive memory element
S Connection point
VDD Power supply voltage
Vhigh High voltage
Vlow Low voltage
VINV Threshold voltage of inverter

The invention claimed is:

1. A read circuit that reads an output of a memory unit, the read circuit comprising:
a dynamic load unit having one end connected to a side of a power supply and the other end connected to a side of the memory unit; and
a feedback unit that, by a feedback of a voltage obtained by a voltage division between the dynamic load unit and the memory unit, holds the voltage obtained by the voltage division, wherein the dynamic load unit includes an array unit in which a plurality of resistive memory elements are connected in series, in parallel, or in series-parallel.

2. The read circuit according to claim 1, wherein
the dynamic load unit includes a PMOS transistor, and
the PMOS transistor is connected in series between the power supply and the array unit, connected in series between the array unit and the feedback unit, or connected in parallel between the power supply and the feedback unit.

3. The read circuit according to claim 1, wherein
the feedback unit includes a feedback transistor and an inverter,
the feedback transistor is a PMOS transistor connected between a port the dynamic load unit in a direction opposite to an end thereof on the side of the power supply, and an output of the memory unit, or a PMOS transistor connected between the power supply and the end of the dynamic load unit on the side of the power supply, and
the inverter is connected between the output of the memory unit and a gate of the feedback transistor.

4. The read circuit according to claim 1, further comprising a switching unit between the feedback unit and the memory unit, wherein the switching unit switches between a first operation including an operation of disconnecting the feedback unit and the memory unit and an operation of charging the feedback unit with a power supply voltage, and a second operation including an operation of connecting the feedback unit and the memory unit and an operation of stopping the charging of the feedback unit with the power supply voltage.

5. The read circuit according to claim 1, wherein the resistive memory element is a memory element with variable resistance that includes a conductive electrode at one end and a reading electrode at the other end, and changes in resistance when writing current is supplied to the conductive electrode, or a memory element that includes a tunnel barrier layer between a magnetization fixed layer and a magnetization free layer, and changes in resistance when writing current is supplied to the magnetization fixed layer or the magnetization free layer.

6. The read circuit according to claim 1, wherein the memory unit includes a cell in which the resistive memory elements are disposed in an array form, and a selecting unit that selects the resistive memory element in the cell.

7. A logic circuit which includes the read circuit of claim 1, comprising:
a memory unit;
a writing unit that writes a logic operating function of the memory unit; and
a reading unit that reads an output of the memory unit, wherein the reading unit is the read circuit.

8. A logic circuit which includes the read circuit of claim 2, comprising:
a memory unit;
a writing unit that writes a logic operating function of the memory unit; and
a reading unit that reads an output of the memory unit, wherein the reading unit is the read circuit.

9. A logic circuit which includes the read circuit of claim 3, comprising:
a memory unit;
a writing unit that writes a logic operating function of the memory unit; and a reading unit that reads an output of the memory unit, wherein the reading unit is the read circuit.

10. A logic circuit which includes the read circuit of claim 4, comprising:
a memory unit;
a writing unit that writes a logic operating function of the memory unit; and
a reading unit that reads an output of the memory unit, wherein the reading unit is the read circuit.

11. A logic circuit which includes the read circuit of claim 5, comprising:
a memory unit;
a writing unit that writes a logic operating function of the memory unit; and
a reading unit that reads an output of the memory unit, wherein the reading unit is the read circuit.

12. A logic circuit which includes the read circuit of claim 6, comprising:
a memory unit;
a writing unit that writes a logic operating function of the memory unit; and
a reading unit that reads an output of the memory unit, wherein the reading unit is the read circuit.

\* \* \* \* \*